United States Patent
Lai et al.

(10) Patent No.: US 12,368,127 B2
(45) Date of Patent: Jul. 22, 2025

(54) SEMICONDUCTOR CHIP PACKAGE HAVING UNDERFILL MATERIAL SURROUNDING A FAN-OUT PACKAGE AND CONTACTING A STRESS BUFFER STRUCTURE SIDEWALL

(71) Applicant: Taiwan Semiconductor Manufacturing Company Limited, Hsinchu (TW)

(72) Inventors: Po-Chen Lai, Hsinchu (TW); Ming-Chih Yew, Hsinchu (TW); Shu-Shen Yeh, Taoyuan (TW); Po-Yao Lin, Zhudong Township (TW); Shin-Puu Jeng, Po-Shan Village (TW)

(73) Assignee: Taiwan Semiconductor Manufacturing Company Limited, Hsinchu (TW)

(*) Notice: Subject to any disclaimer, the term of this patent is extended or adjusted under 35 U.S.C. 154(b) by 475 days.

(21) Appl. No.: 17/748,426

(22) Filed: May 19, 2022

(65) Prior Publication Data

US 2023/0136656 A1  May 4, 2023

Related U.S. Application Data

(60) Provisional application No. 63/273,585, filed on Oct. 29, 2021.

(51) Int. Cl.
*H01L 23/00* (2006.01)
*H01L 21/48* (2006.01)
(Continued)

(52) U.S. Cl.
CPC .......... *H01L 24/32* (2013.01); *H01L 21/4853* (2013.01); *H01L 21/563* (2013.01); *H01L 21/565* (2013.01); *H01L 23/3135* (2013.01); *H01L 23/49816* (2013.01); *H01L 23/49822* (2013.01); *H01L 23/49833* (2013.01); *H01L 23/49838* (2013.01); *H01L 24/16* (2013.01); *H01L 24/73* (2013.01); *H01L 25/0652* (2013.01); *H01L 25/105* (2013.01); *H01L 21/561* (2013.01); *H01L 21/568* (2013.01);
(Continued)

(58) Field of Classification Search
CPC .  H01L 21/563; H01L 21/565; H01L 23/3135; H01L 21/56–568; H01L 23/31–3192; H01L 23/562
See application file for complete search history.

(56) References Cited

U.S. PATENT DOCUMENTS

| | | | | |
|---|---|---|---|---|
| 9,842,811 | B1* | 12/2017 | Chou | ........................ H01L 24/48 |
| 2012/0119354 | A1* | 5/2012 | Tsai | ........................ H01L 23/562 |
| | | | | 257/737 |
| 2012/0126402 | A1* | 5/2012 | Hatakeyama | ......... H01L 21/561 |
| | | | | 257/737 |
| 2013/0082399 | A1* | 4/2013 | Kim | ........................ H01L 25/50 |
| | | | | 257/E23.145 |

(Continued)

*Primary Examiner* — Younes Boulghassoul
(74) *Attorney, Agent, or Firm* — The Marbury Law Group, PLLC

(57) ABSTRACT

A fan-out package includes at least one semiconductor die attached to an interposer structure. a molding compound die frame laterally surrounding the at least one semiconductor die and including a molding compound material, and at least one stress buffer structure located on the interposer structure and including a stress buffer material having a first Young's modulus. The molding compound die frame includes a molding compound material having a second Young's modulus that is greater than the first Young's modulus.

20 Claims, 29 Drawing Sheets

(51) Int. Cl.
*H01L 21/56* (2006.01)
*H01L 23/31* (2006.01)
*H01L 23/498* (2006.01)
*H01L 25/065* (2023.01)
*H01L 25/10* (2006.01)

(52) U.S. Cl.
CPC .......... *H01L 24/81* (2013.01); *H01L 25/0657* (2013.01); *H01L 2224/16135* (2013.01); *H01L 2224/16227* (2013.01); *H01L 2224/16238* (2013.01); *H01L 2224/26155* (2013.01); *H01L 2224/26175* (2013.01); *H01L 2224/73204* (2013.01); *H01L 2224/81815* (2013.01); *H01L 2225/06513* (2013.01); *H01L 2225/06517* (2013.01); *H01L 2225/0652* (2013.01); *H01L 2225/06527* (2013.01); *H01L 2225/06548* (2013.01); *H01L 2225/06589* (2013.01); *H01L 2924/1431* (2013.01); *H01L 2924/1437* (2013.01); *H01L 2924/182* (2013.01); *H01L 2924/186* (2013.01); *H01L 2924/3511* (2013.01); *H01L 2924/3512* (2013.01)

(56) References Cited

U.S. PATENT DOCUMENTS

| | | | |
|---|---|---|---|
| 2014/0264813 A1* | 9/2014 | Lin | H01L 23/295 257/690 |
| 2015/0200186 A1* | 7/2015 | Park | H01L 23/481 257/734 |
| 2018/0269160 A1* | 9/2018 | Su | H01L 23/3737 |
| 2018/0294202 A1* | 10/2018 | Cheng | H01L 21/565 |
| 2019/0319000 A1* | 10/2019 | Lin | H01L 23/3185 |
| 2021/0066148 A1* | 3/2021 | Kim | H01L 24/83 |
| 2022/0102313 A1* | 3/2022 | Jeng | H01L 23/49822 |
| 2022/0181225 A1* | 6/2022 | Chen | H01L 23/5385 |
| 2022/0230990 A1* | 7/2022 | Yew | H01L 21/561 |
| 2022/0293563 A1* | 9/2022 | Ko | H01L 23/3135 |
| 2022/0344174 A1* | 10/2022 | Lai | H01L 21/6835 |
| 2022/0406671 A1* | 12/2022 | Hsu | H01L 23/562 |
| 2023/0023380 A1* | 1/2023 | Hsu | H01L 21/6835 |
| 2023/0060756 A1* | 3/2023 | Lai | H01L 23/49822 |
| 2023/0083522 A1* | 3/2023 | Ide | H01L 25/50 257/668 |

* cited by examiner

SEMICONDUCTOR CHIP PACKAGE HAVING UNDERFILL MATERIAL SURROUNDING A FAN-OUT PACKAGE AND CONTACTING A STRESS BUFFER STRUCTURE SIDEWALL

RELATED APPLICATIONS

This application claims the benefit of priority from a U.S. provisional application Ser. No. 63/273,585, titled "Stress Buffer Structures for Semiconductor Die Packaging and Methods for Forming the Same," filed on Oct. 29, 2021, the entire contents of which are incorporated herein by reference.

BACKGROUND

Interfaces between a fan-out wafer level package (FOWLP) and an underfill material portion are subjected to mechanical stress during subsequent handling of an assembly of the FOWLP, the underfill material portion, and a packaging substrate, such as the mechanical stress associated with attaching the packaging substrate to a printed circuit board (PCB). In addition, interfaces between a fan-out wafer level package (FOWLP) and an underfill material portion are subjected to mechanical stress during use within a computing device, such as when a mobile device is accidently dropped to cause a mechanical shock during usage. Cracks may be formed in the underfill material, and may induce additional cracks in a semiconductor die, solder material portions, interposer structures, and/or various dielectric layers within a semiconductor die or within a package substrate. Thus, formation of cracks in the underfill material needs to be suppressed.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1A:
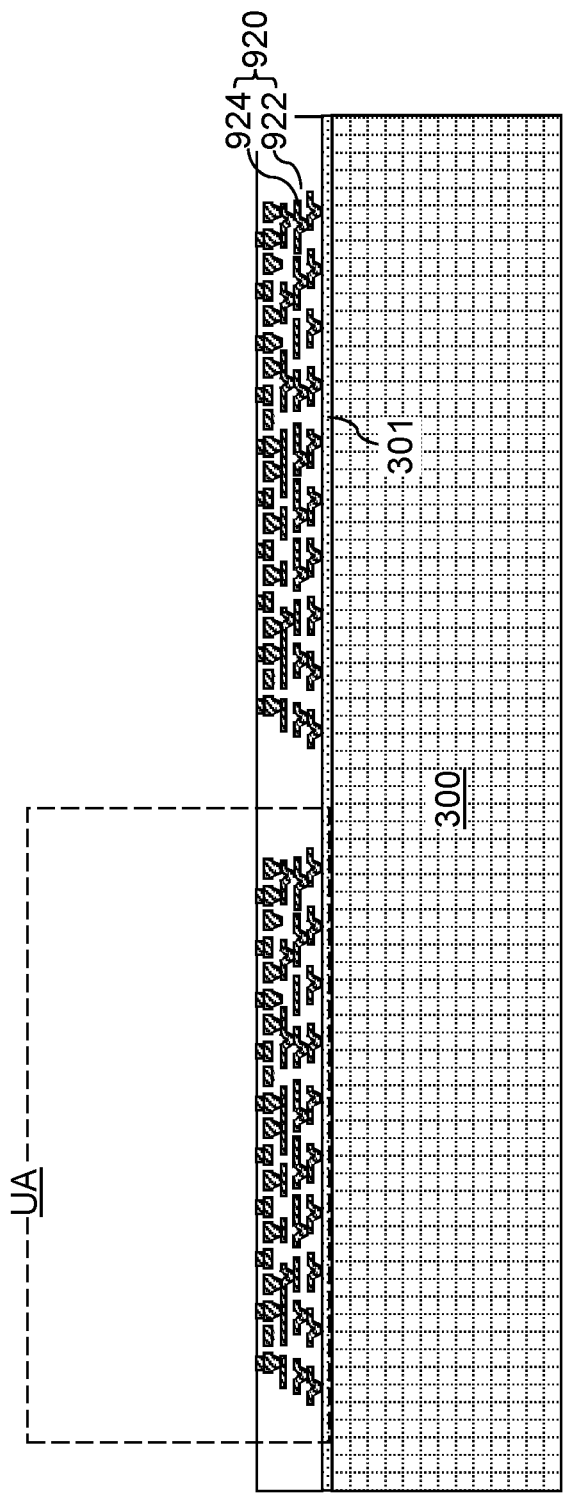
FIG. 1A is a vertical cross-sectional view of a region of an exemplary structure that includes a first carrier substrate and interposer structures according to an embodiment of the present disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly. Unless explicitly stated otherwise, each element having the same reference numeral is presumed to have the same material composition and to have a thickness within a same thickness range.

The present disclosure is directed to semiconductor devices, and particularly to uniform application of an underfill material in semiconductor die packaging. Generally, the methods and structures of the present disclosure may be used to provide a chip package structure such as a fan-out wafer level package (FOWLP) and fan-out panel level package (FOPLP). While the present disclosure is described employing an FOWLP configuration, the methods and structures of the present disclosure may be implemented in an FOPLP configuration or any other fan-out package configuration.

Fan-out packages are subject to deformation under stress during subsequent assembly processes and/or during operation under mechanical stress and/or under heat. According to an aspect of the present disclosure, deformation of a fan-out package may be reduced by using at least one stress buffer structure that is incorporated into a fan-out package. The at least one stress buffer structure may have a lower Young's modulus and/or a higher coefficient of thermal expansion than a molding compound material that laterally surrounds at least one semiconductor die in a fan-out package, and prevent or reduce deformation of a fan-out package under mechanical stress or under thermal stress.

Typically, heterogeneous integration is used to integrate a large interposer (such as a CoWoS interposer or an organic interposer) and a high electrical performance substrate (such as a multi-layer core or a multilayer substrate (which may include 12 or more layers) for a high performance chip. The effective coefficient of thermal expansion for such a structure may be more than four times the coefficient of thermal expansion for silicon. Such a large mismatch of coefficients of thermal expansion between a substrate and semiconductor dies on an interposer results in molding crack at fan-out module corners. For these reasons, large fan-out modules formed by molding have high crack risk at the corners. According to an aspect of the present disclosure, an embedded stress buffer structure may be provided on an interposer such as a redistribution structure to effectively reduce the molding stress, thereby preventing formation of molding cracks in corner region of an interposer, and providing enhanced reliability to the interposer. The various aspects and embodiments of the methods and structures of the present disclosure are now described with reference to accompanying drawings.

Figure 1B:
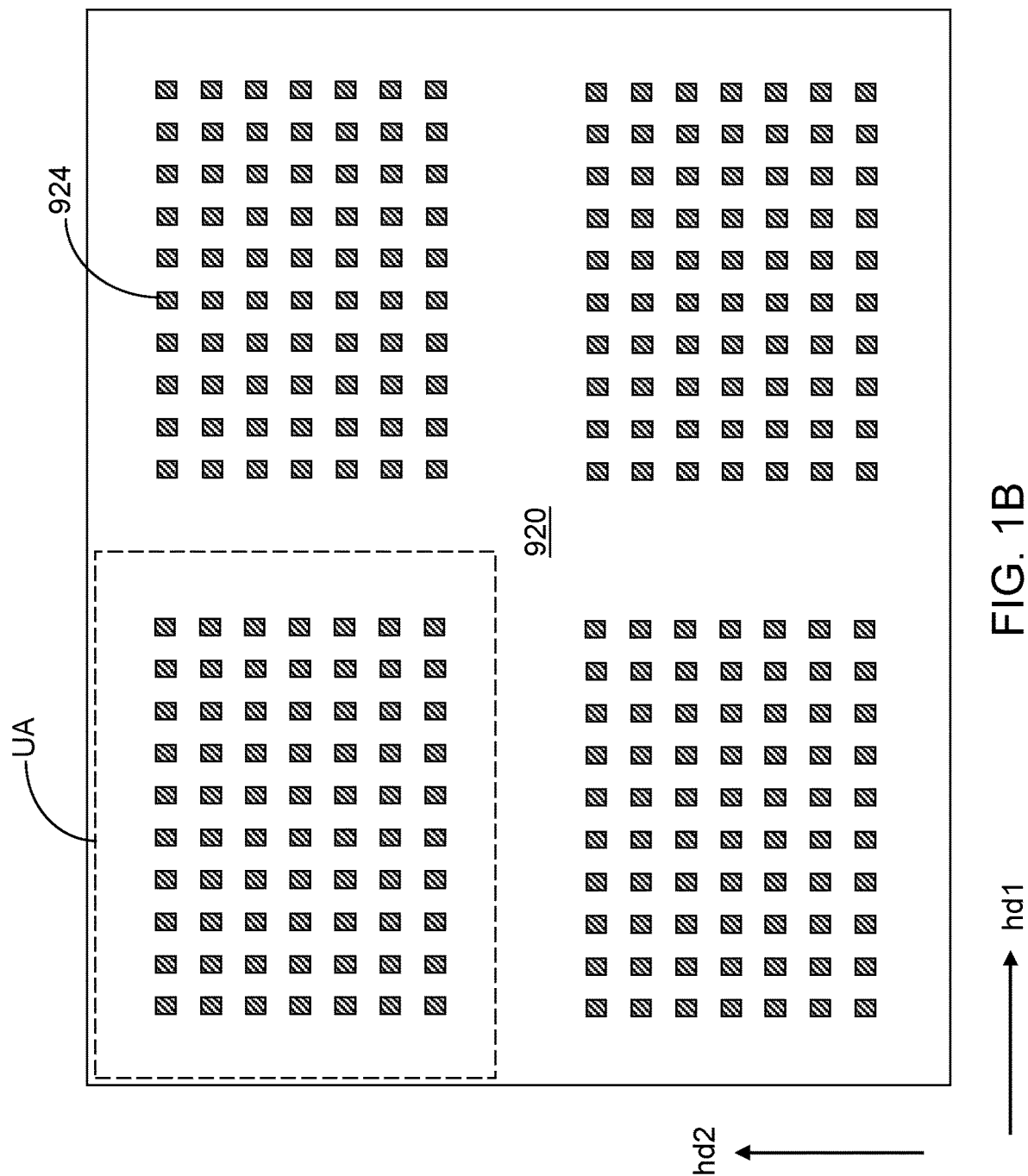
FIG. 1B is a top-down view of the region of the exemplary structure of FIG. 1A.

Referring to FIGS. 1A and 1B, an exemplary structure according to an embodiment of the present disclosure includes a first carrier substrate 300 and an interposer structure 920 formed on a front side surface of the first carrier substrate 300. The first carrier substrate 300 may include an optically transparent substrate such as a glass substrate or a sapphire substrate. The diameter of the first carrier substrate 300 may be in a range from 150 mm to 290 mm, although lesser and greater diameters may be used. In addition, the thickness of the first carrier substrate 300 may be in a range from 500 microns to 2,000 microns, although lesser and greater thicknesses may also be used. Alternatively, the first carrier substrate 300 may be provided in a rectangular panel format.

A first adhesive layer 301 may be applied to the front-side surface of the first carrier substrate 300. In one embodiment, the first adhesive layer 301 may be a light-to-heat conversion (LTHC) layer. The LTHC layer may be a solvent-based coating applied using a spin coating method. The LTHC layer may convert ultraviolet light to heat, which may cause the material of the LTHC layer to lose adhesion. For example, the LTHC layer may include Light-To-Heat Conversion Release Coating (LTHC) ink™ that is commercially available from The 3M Company®. Alternatively, the first adhesive layer 301 may include a thermally decomposing adhesive material. For example, the first adhesive layer 301 may include an acrylic pressure-sensitive adhesive that decomposes at an elevated temperature. The debonding temperature of the thermally decomposing adhesive material may be in a range from 150 degrees to 200 degrees Celsius.

The interposer structure 920 may includes redistribution structures, which may be formed over the first adhesive layer 301. Specifically, an interposer structure 920 may be formed within each unit area UA, which is the area of a repetition unit that is repeated in a two-dimensional array over the first carrier substrate 300. Each interposer structure 920 may include redistribution dielectric layers 922 and redistribution wiring interconnects 924. The redistribution dielectric layers 922 include a respective dielectric polymer material such as polyimide (PI), benzocyclobutene (BCB), or polybenzobisoxazole (PBO). Other suitable materials may be within the contemplated scope of disclosure. Each redistribution dielectric layer 922 may be formed by spin coating and drying of the respective dielectric polymer material. The thickness of each redistribution dielectric layer 922 may be in a range from 2 microns to 40 microns, such as from 4 microns to 20 microns. Each redistribution dielectric layer 922 may be patterned, for example, by applying and patterning a respective photoresist layer thereabove, and by transferring the pattern in the photoresist layer into the redistribution dielectric layer 922 using an etch process such as an anisotropic etch process. The photoresist layer may be subsequently removed, for example, by ashing.

Each of the redistribution wiring interconnects 924 may be formed by depositing a metallic seed layer by sputtering, by applying and patterning a photoresist layer over the metallic seed layer to form a pattern of openings through the photoresist layer, by electroplating a metallic fill material (such as copper, nickel, or a stack of copper and nickel), by removing the photoresist layer (for example, by ashing), and by etching portions of the metallic seed layer located between the electroplated metallic fill material portions. The metallic seed layer may include, for example, a stack of a titanium barrier layer and a copper seed layer. The titanium barrier layer may have thickness in a range from 50 nm to 400 nm, and the copper seed layer may have a thickness in a range from 100 nm to 500 nm. The metallic fill material for the redistribution wiring interconnects 924 may include copper, nickel, or copper and nickel. Other suitable metallic fill materials are within the contemplated scope of disclosure. The thickness of the metallic fill material that is deposited for each redistribution wiring interconnect 924 may be in a range from 2 microns to 40 microns, such as from 4 microns to 10 microns, although lesser or greater thicknesses may also be used. The total number of levels of wiring in each interposer structure 920 (i.e., the levels of the redistribution wiring interconnects 924) may be in a range from 1 to 10. A periodic two-dimensional array (such as a rectangular array) of interposer structures 920 may be formed over the first carrier substrate 300. Each interposer structure 920 may be formed within a unit area UA, which is a unit of repetition for a two-dimensional array of interposer structures 920. The layer including all interposer structures 920 is herein referred to as an interposer structure layer. The interposer structure layer includes a two-dimensional array of interposer structures 920. In one embodiment, the two-dimensional array of interposer structures 920 may be a rectangular periodic two-dimensional array of interposer structures 920 having a first periodicity along a first horizontal direction hd1 and having a second periodicity along a second horizontal direction hd2 that is perpendicular to the first horizontal direction hd1.

Figure 2A:
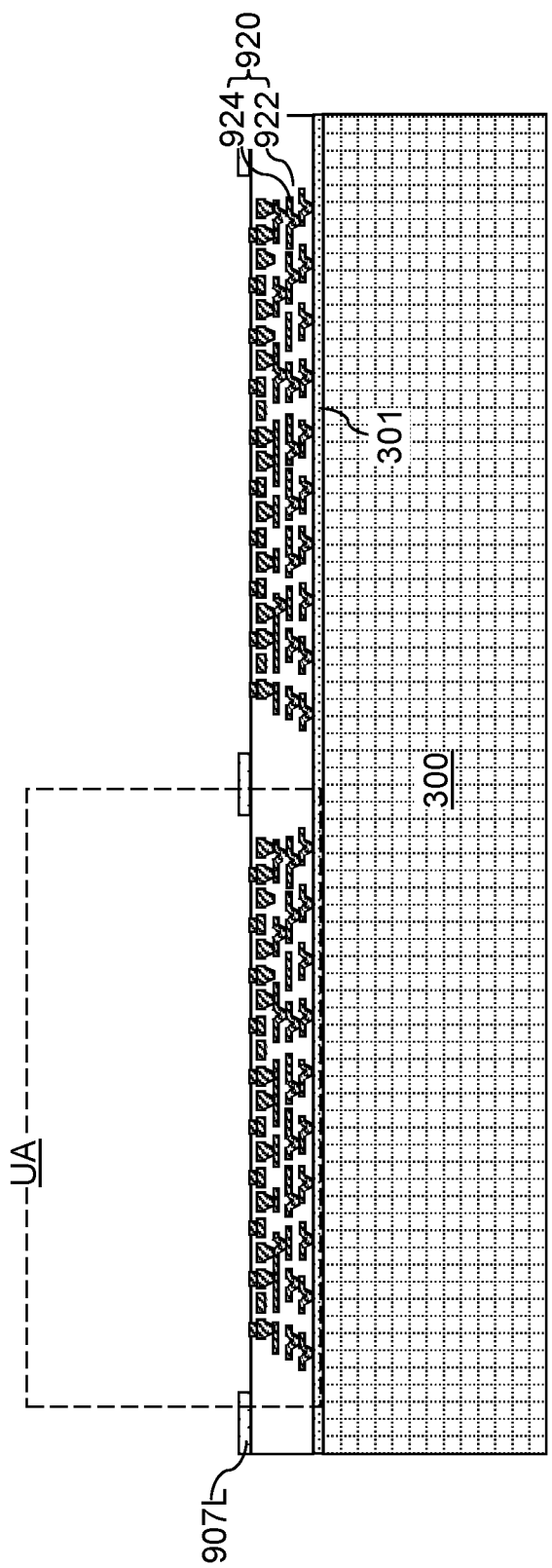
FIG. 2A is a vertical cross-sectional view of a region of the exemplary structure after formation of a patterned stress buffer layer according to an embodiment of the present disclosure.
Figure 2B:
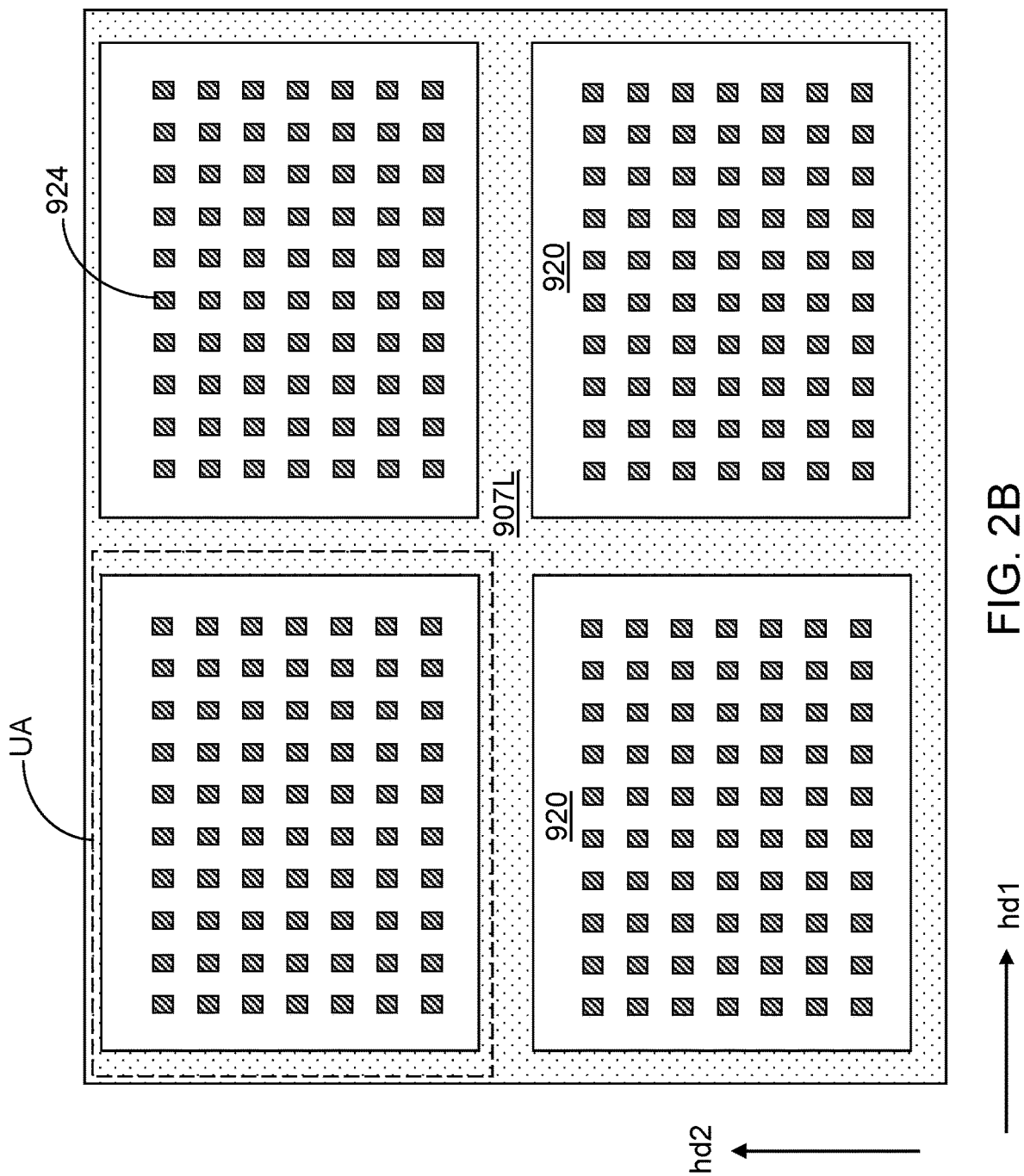
FIG. 2B is a top-down view of the region of the exemplary structure of FIG. 2A.

Referring to FIGS. 2A and 2B, a stress buffer material that may absorb mechanical stress may be deposited over the top surface of the interposer structure layer, and may be patterned into a stress buffer layer 907L. The stress buffer material may include a material that may absorb mechanical stress better than a molding compound material to be subsequently used. For example, the stress buffer material may have a first Young's modulus, and the molding compound material to be subsequently used may have a second Young's modulus that is higher than the first Young's modulus. Thus, the stress buffer material deforms more easily than the molding compound material to be subsequently used. In some embodiments, the stress buffer layer 907L or other stress buffer structure may be formed by molding the stress buffer material on the surface of the interposer structures 920 or by attaching the stress buffer layer 907L or other stress buffer structure on the surface of the interposer structures 920. In a non-limiting illustrative example, the ratio of the first Young's modulus to the second Young's modulus may be in a range from 0.001 to 0.90, such as from 0.01 to 0.5 and/or from 0.1 to 0.3.

Further, the stress buffer material may include a material providing more thermal expansion than the molding compound material to be subsequently used. In one embodiment, the stress buffer material of the stress buffer layer 907L may comprise, and/or may consist essentially of, a material having a first coefficient of thermal expansion at room temperature (i.e., at 20 degrees Celsius), and the molding compound material to be subsequently used may comprise, and/or may consist essentially of, a material having a second coefficient of thermal expansion at room temperature that is lower than the first coefficient of thermal expansion at room temperature. In a non-limiting illustrative example, the ratio of the first coefficient of thermal expansion to the second coefficient of thermal expansion may be in a range from 1.01 to 10, such as from 1.5 to 5 and/or from 2 to 3.

In an illustrative example, the stress buffer material may comprise a polymer material or an epoxy-based material. In one embodiment, the stress buffer material may be selected from polyimide (PI), polybenzoxazole (PBO), benzocyclobutene (BCB), and silicone. Polyimide has Young's modulus of about 2.5 GPa. Polybenzoxazole has Young's modulus of about 3.5 GPa. Benzocyclobutene has Young's modulus of about 2.9 GPa. The stress buffer layer 907L may be formed by spin-coating or chemical vapor deposition, and may be patterned by applying and patterning a photoresist thereabove, and by transferring the pattern in the photoresist layer through the stress buffer layer 907L by etching unmasked portions of the stress buffer layer 907L. The thickness of the stress buffer layer 907L may be in a range from 5% to 50% of the thickness of a molding compound die frame to be subsequently formed. In one embodiment, the stress buffer layer 907L may be in a range from 10 microns to 200 microns, although lesser and greater thicknesses may also be used.

In one embodiment, the stress buffer layer 907L may be patterned to form a contiguous opening within each unit area UA such that all areas of the physically exposed surfaces of the redistribution wiring interconnects 924 within the unit area UA may be physically exposed, and may be laterally surrounded by a periphery of a respective opening in the stress buffer layer 907L. In one embodiment, each opening in the stress buffer layer 907L may have a rectangular shape such that a pair of lengthwise sidewalls is parallel to the first horizontal direction hd1, and a pair of widthwise sidewalls is parallel to the second horizontal direction hd2. In this embodiment, the distance between a rectangular boundary of each unit area UA and edges of the opening in the stress buffer layer 907L within the unit area UA may be in a range from 200 microns to 1.5 mm, such as from 300 microns to 1.0 mm, although lesser and greater distances may also be used. Generally, the stress buffer layer 907L may contact segments of a planar surface (such as the top surface) of the interposer structure layer.

Figure 3A:
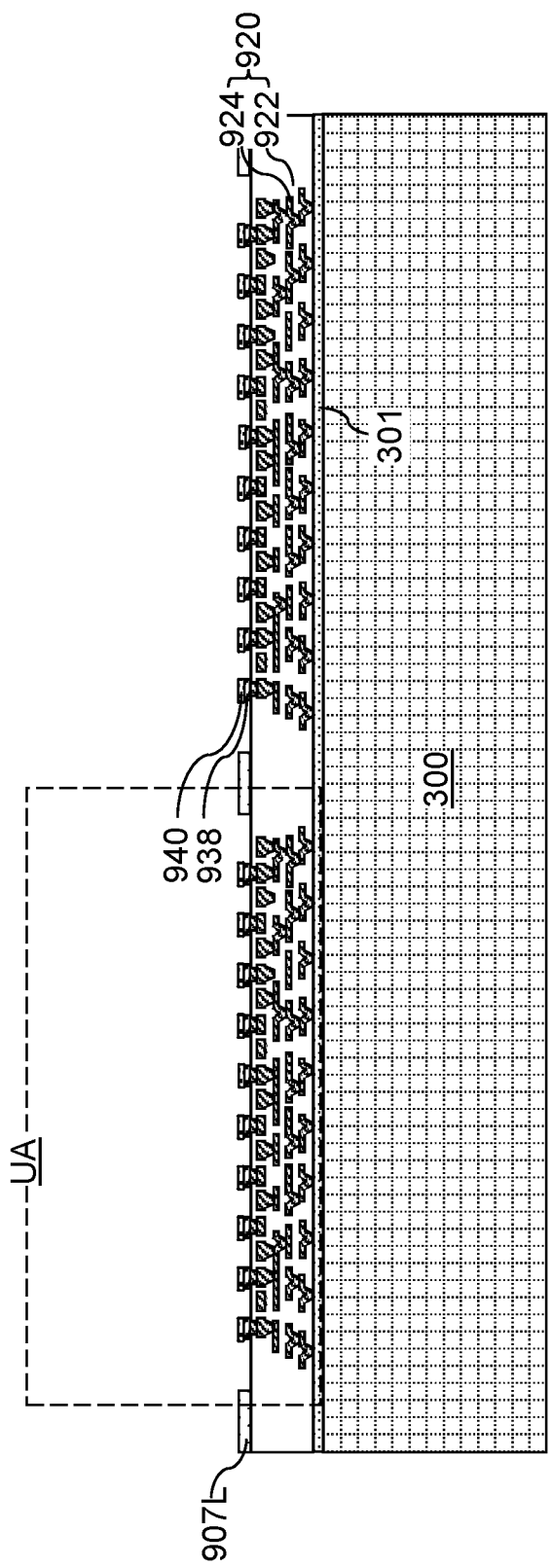
FIG. 3A is vertical cross-sectional view of a region of the exemplary structure after formation of redistribution-side metal bonding structures and first solder material portions according to an embodiment of the present disclosure.
Figure 3B:
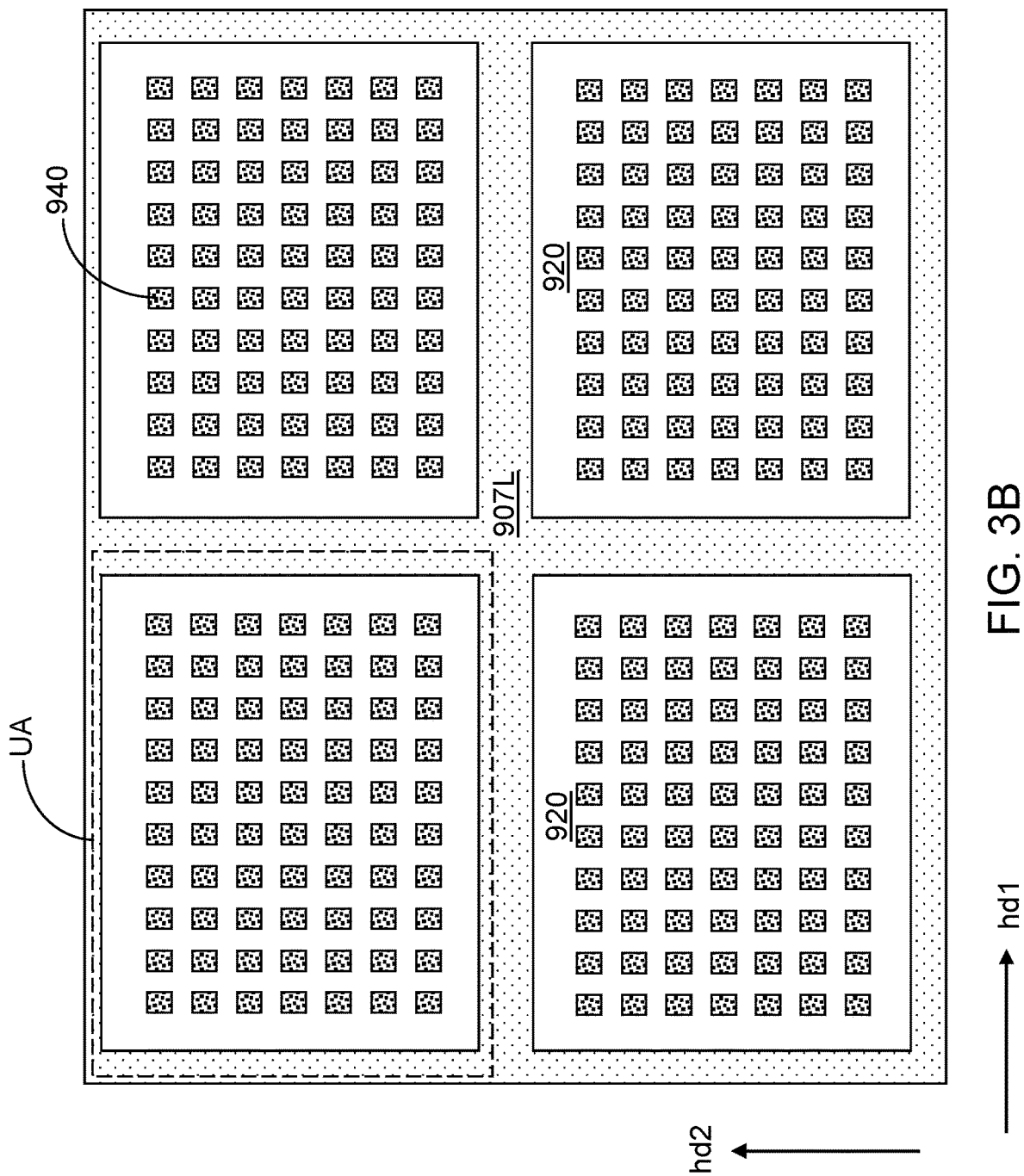
FIG. 3B is a top-down view of the region of the exemplary structure of FIG. 3A.

Referring to FIGS. 3A and 3B, at least one metallic material and a first material may be sequentially deposited over the front-side surface of the interposer structures 920. The at least one metallic material comprises a material that may be used for metallic bumps, such as copper. The thickness of the at least one metallic material may be in a range from 5 microns to 60 microns, such as from 10 microns to 30 microns, although lesser and greater thicknesses may also be used. The first material may comprise a first material suitable for C2 bonding, i.e., for microbump bonding. The thickness of the first material may be in a range from 2 microns to 30 microns, such as from 4 microns to 15 microns, although lesser and greater thicknesses may also be used.

The first material and the at least one metallic material may be patterned into discrete arrays of first solder material portions 940 and arrays of metal bonding structures, which are herein referred to as arrays of redistribution-side metal bonding structures 938. Each array of redistribution-side metal bonding structures 938 is formed within a respective unit area UA. Each array of first solder material portions 940 is formed within a respective unit area UA. Each first solder material portion 940 may have a same horizontal cross-sectional shape as an underlying redistribution-side metal bonding structures 938.

In one embodiment, the redistribution-side metal bonding structures 938 may include, and/or may consist essentially of, copper or a copper-containing alloy. Other suitable materials are within the contemplated scope of disclosure. The thickness of the redistribution-side metal bonding structures 938 may be in a range from 5 microns to 60 microns, although lesser or greater thicknesses may also be used. The redistribution-side metal bonding structures 938 may have horizontal cross-sectional shapes of rectangles, rounded rectangles, circles, regular polygons, irregular polygons, or any other two-dimensional curvilinear shape having a closed periphery. In one embodiment, redistribution-side metal bonding structures 938 may be configured for microbump bonding (i.e., C2 bonding), and may have a thickness in a range from 10 microns to 30 microns, although lesser or greater thicknesses may also be used. In this embodiment, each array of redistribution-side metal bonding structures 938 may be formed as an array of microbumps (such as copper pillars) having a lateral dimension in a range from 10 microns to 25 microns, and having a pitch in a range from 20 microns to 50 microns.

Figure 4A:
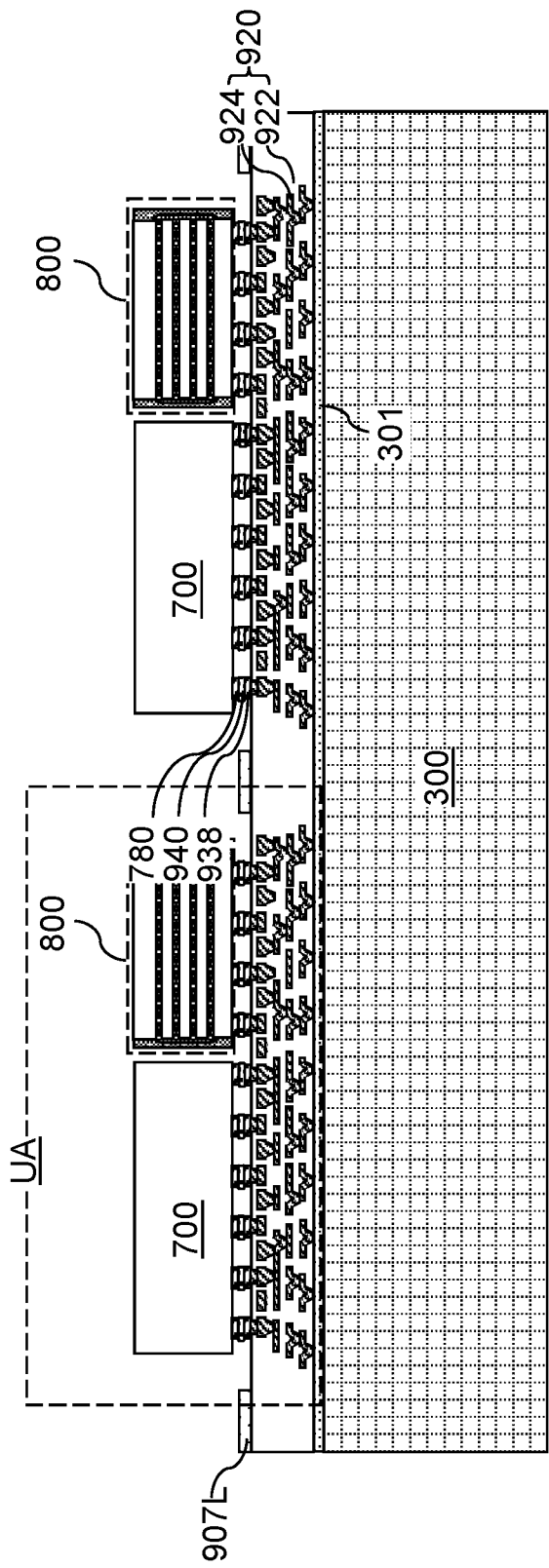
FIG. 4A is a vertical cross-sectional view of a region the exemplary structure after attaching semiconductor dies according to an embodiment of the present disclosure.
Figure 4B:
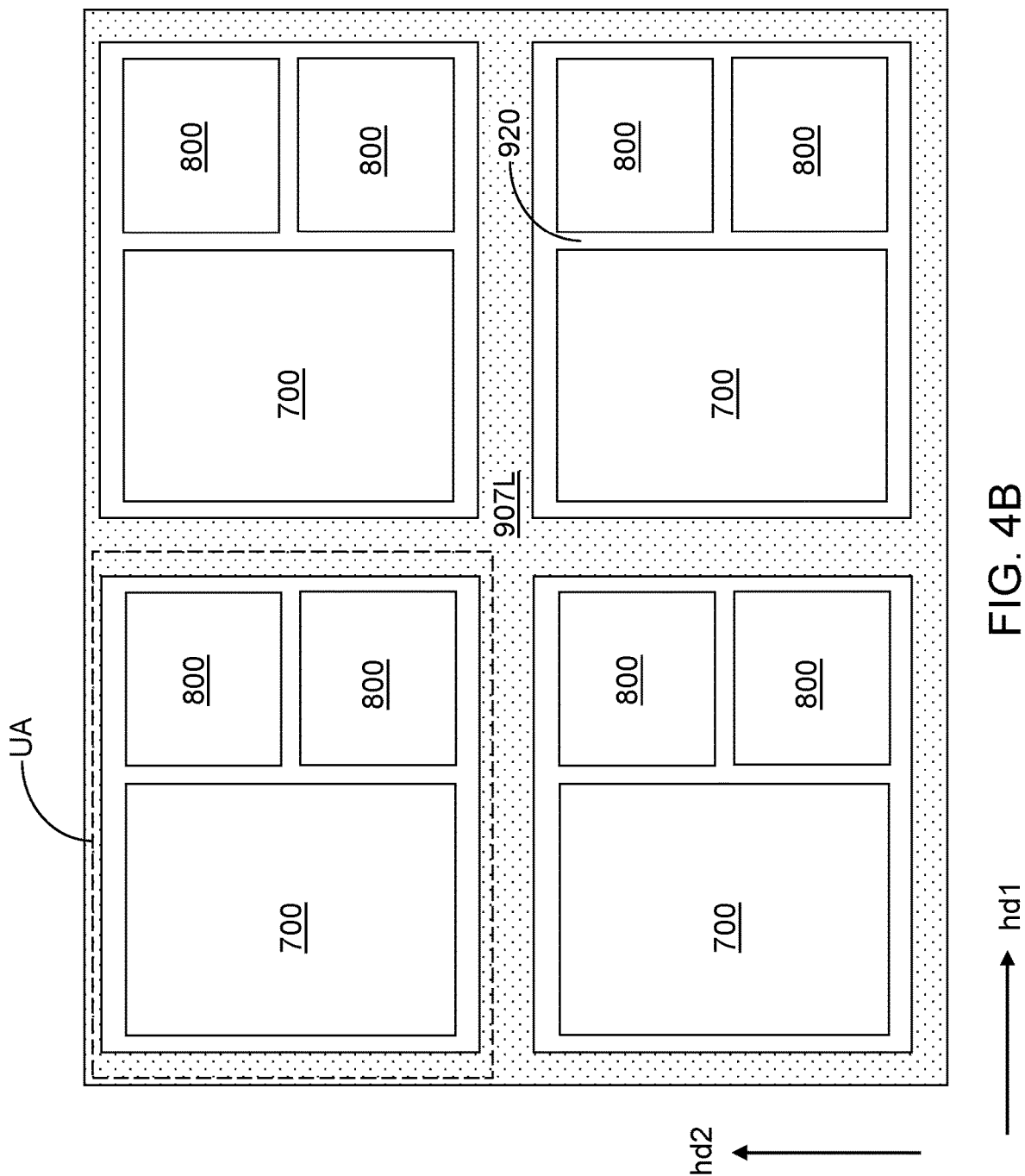
FIG. 4B is a top-down view of the region of the exemplary structure of FIG. 4A.

Referring to FIGS. 4A and 4B, a set of at least one semiconductor die (700, 800) may be bonded to each interposer structure 920. In one embodiment, the interposer structures 920 may be arranged as a two-dimensional periodic array, and multiple sets of at least one semiconductor die (700, 800) may be bonded to the interposer structures 920 as a two-dimensional periodic rectangular array of sets of the at least one semiconductor die (700, 800). Each set of at least one semiconductor die (700, 800) includes at least one semiconductor die. Each set of at least one semiconductor die (700, 800) may include any set of at least one semiconductor die known in the art. In one embodiment, each set of at least one semiconductor die (700, 800) may comprise a plurality of semiconductor dies (700, 800). For example, each set of at least one semiconductor die (700, 800) may include at least one system-on-chip (SoC) die 700 and/or at least one memory die 800. Each SoC die 700 may comprise an application processor die, a central processing unit die, or a graphic processing unit die. In one embodiment, the at least one memory die 800 may comprise a high bandwidth memory (HBM) die that includes a vertical stack of static random access memory dies. In one embodiment, the at least one semiconductor die (700, 800) may include at least one system-on-chip (SoC) die and a high bandwidth memory (HBM) die including a vertical stack of static random access memory (SRAM) dies that are interconnected to one another through microbumps and are laterally surrounded by an epoxy molding material enclosure frame.

Figure 4C:
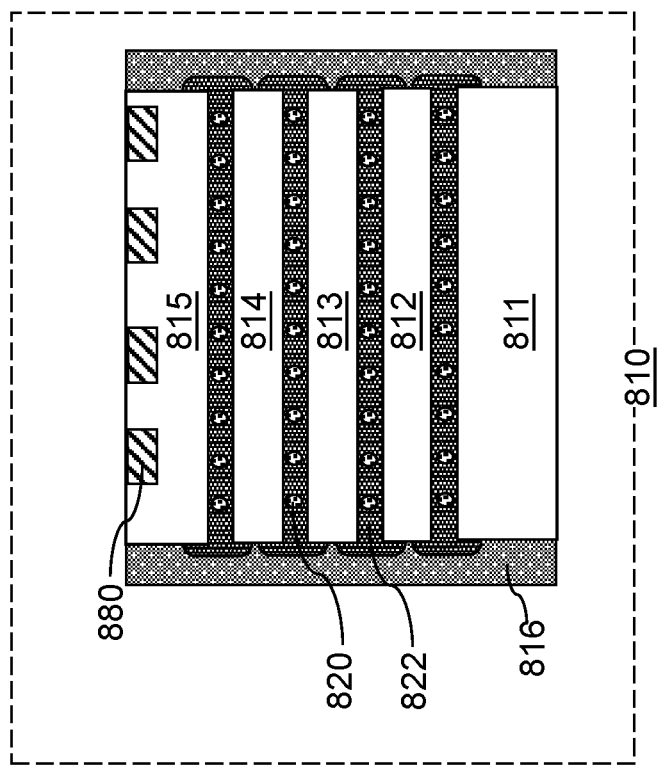
FIG. 4C is a magnified vertical cross-sectional view of a high bandwidth memory die.

Referring to FIGS. 4A and 4C, each semiconductor die (700, 800) may comprise a respective array of die-side metal bonding structures (780, 880). For example, each SoC die 700 may comprise an array of SoC metal bonding structures 780, and each memory die 800 may comprise an array of memory-die metal bonding structures 880. Each of the semiconductor dies (700, 800) may be positioned in a face-down position such that die-side metal bonding structures (780, 880) face the first solder material portions 940. Each set of at least one semiconductor die (700, 800) may be placed within a respective unit area UA. Placement of the semiconductor dies (700, 800) may be performed using a pick and place apparatus so that each of the die-side metal bonding structures (780, 880) is placed on a top surface of a respective one of the first solder material portions 940.

Generally, an interposer structure 920 including redistribution-side metal bonding structures 938 thereupon may be provided, and at least one semiconductor die (700, 800) including a respective set of die-side metal bonding structures (780, 880) may be provided. The at least one semiconductor die (700, 800) may be bonded to the interposer structure 920 using first solder material portions 940 that are bonded to a respective redistribution-side metal bonding structure 938 and to a respective one of the die-side metal bonding structures (780, 880).

Each portion of the stress buffer layer 907L located within a respective unit area UA comprises a stress buffer structure. At least one stress buffer structure may be formed on each interposer structure 920. Each set of at least one semiconductor die (700, 800) may be attached to a respective interposer structure 920 using a respective set of first solder material portions 940. The stress buffer layer 907L may be located outside an area of the at least one semiconductor die (700, 800) within each unit area UA in a plan view. Each set of at least one semiconductor die (700, 800) may be attached to a respective interposer structure 920 using a respective set of first solder material portions 940. Each of the at least one stress buffer structure within a unit area UA may be located outside an area including the at least one semiconductor die (700, 800) in the unit area UA in a plan view. The plan view is a view along a vertical direction, which is the direction that is perpendicular to the planar top surface of the interposer structure layer.

Referring to FIG. 4C, a high bandwidth memory (HBM) die 810 is illustrated, which may be used as a memory die 800 within the exemplary structures of FIGS. 4A and 4B. The HBM die 810 includes a vertical stack of static random access memory dies (811, 812, 813, 814, 815) that are interconnected to one another through microbumps 820 and are laterally surrounded by an epoxy molding material enclosure frame 816. The gaps between vertically neighboring pairs of the random access memory dies (811, 812, 813, 814, 815) may be filled with a HBM underfill material portions 822 that laterally surrounds a respective set of microbumps 820. The HBM die 810 may comprise an array of memory-die metal bonding structures 880 configured to be bonded to a subset of an array of redistribution-side metal bonding structures 938 within a unit area UA. The HBM die 810 may be configured to provide a high bandwidth as defined under JEDEC standards, i.e., standards defined by The JEDEC Solid State Technology Association.

Figure 5:
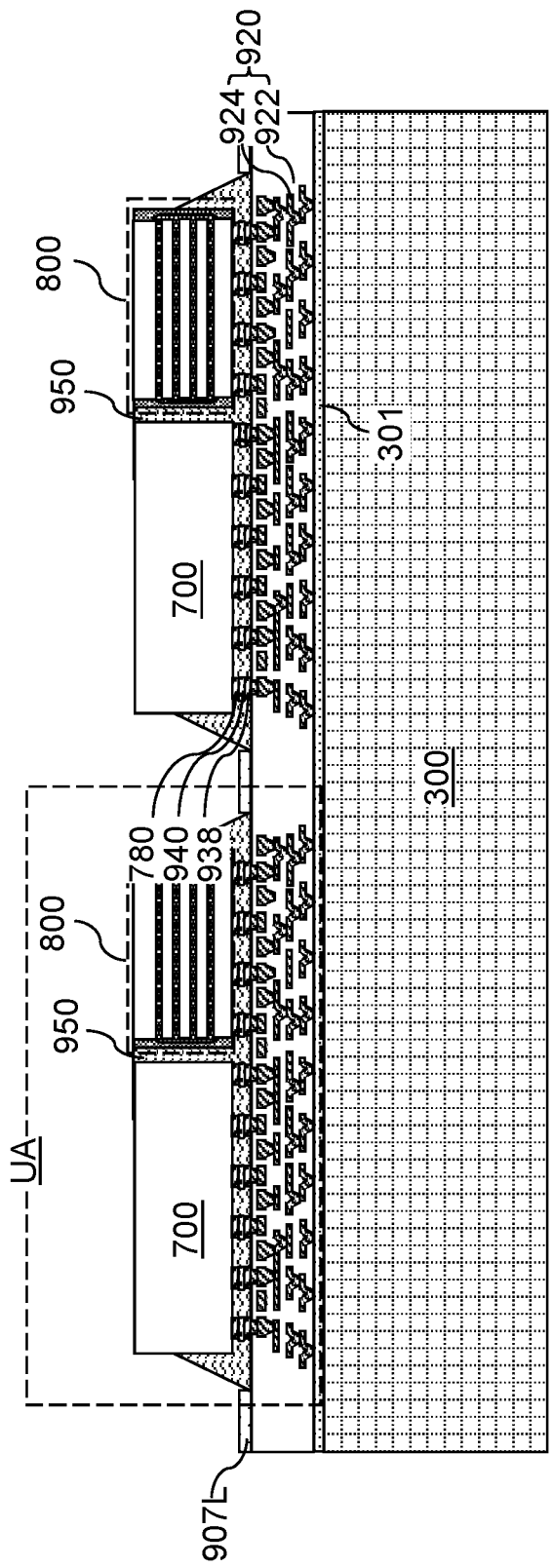
FIG. 5 is a vertical cross-sectional view of a region of the exemplary structure after formation of first underfill material portions.

Referring to FIG. 5, a first underfill material may be applied into each gap between the interposer structures 920 and sets of at least one semiconductor die (700, 800) that are bonded to the interposer structures 920. The first underfill material may comprise any underfill material known in the art. A first underfill material portion 950 may be formed within each unit area UA between an interposer structure 920 and an overlying set of at least one semiconductor die (700, 800). The first underfill material portions 950 may be formed by injecting the first underfill material around a respective array of first solder material portions 940 in a respective unit area UA. Any known underfill material application method may be used, which may be, for example, the capillary underfill method, the molded underfill method, or the printed underfill method.

Within each unit area UA, a first underfill material portion 950 may laterally surround, and contact, each of the first solder material portions 940 within the unit area UA. The first underfill material portion 950 may be formed around, and contact, the first solder material portions 940, the redistribution-side metal bonding structures 938, and the die-side metal bonding structures (780, 880) in the unit area UA.

Each interposer structure 920 in a unit area UA comprises redistribution-side metal bonding structures 938. At least one semiconductor die (700, 800) comprising a respective set of die-side metal bonding structures (780, 880) is attached to the redistribution-side metal bonding structures 938 through a respective set of first solder material portions 940 within each unit area UA. Within each unit area UA, a first underfill material portion 950 laterally surrounds the redistribution-side metal bonding structures 938 and the die-side metal bonding structures (780, 880) of the at least one semiconductor die (700, 800).

In one embodiment, at least a segment of a planar surface of each of the at least one stress buffer structure (which is portion of the stress buffer layer 907L located within a respective unit area UA) is not covered by the first underfill material portion 950 within the respective unit area UA after formation of the first underfill material portions.

Figure 6A:
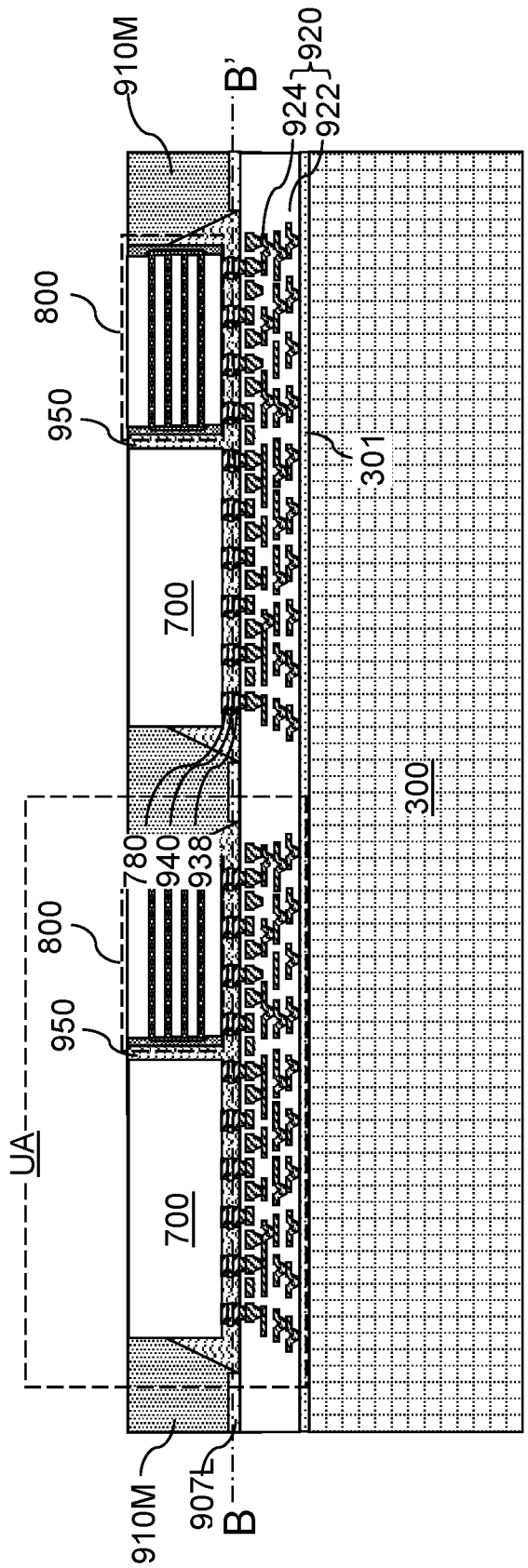
FIG. 6A is a vertical cross-sectional view of a region of the exemplary structure after formation of an epoxy molding compound (EMC) matrix according to an embodiment of the present disclosure.
Figure 6B:
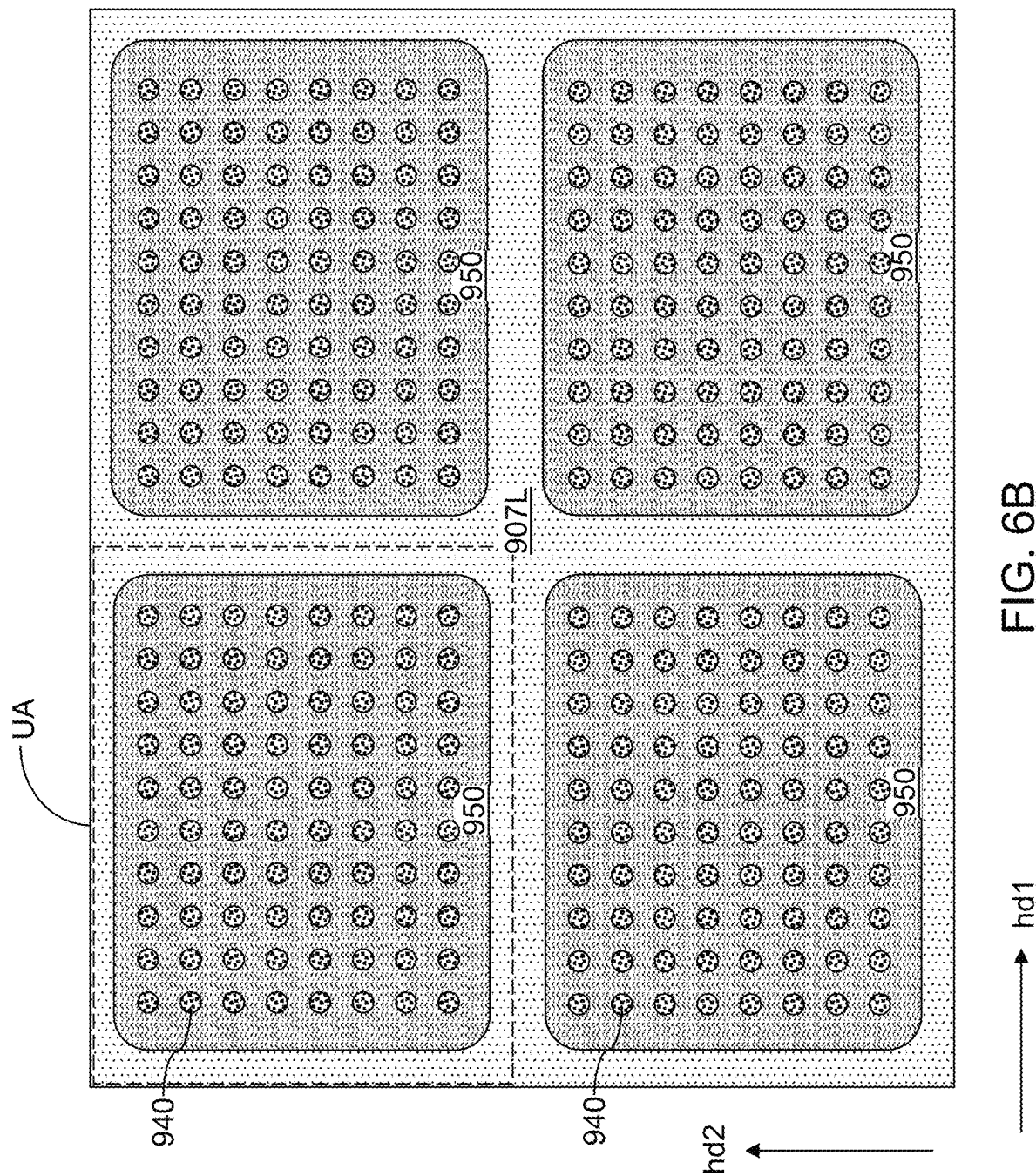
FIG. 6B is a top-down view of the region of the exemplary structure of FIG. 6A.

Referring to FIGS. 6A and 6B, an epoxy molding compound (EMC) may be applied to the gaps between contiguous assemblies of a respective set of semiconductor dies (700, 800) and a first underfill material portion 950.

The EMC may include an epoxy-containing compound that may be hardened (i.e., cured) to provide a dielectric material portion having sufficient stiffness and mechanical strength. The EMC may include epoxy resin, hardener, silica (as a filler material), and other additives. The EMC may be provided in a liquid form or in a solid form depending on the viscosity and flowability. Liquid EMC provides better handling, good flowability, less voids, better fill, and less flow marks. Solid EMC provides less cure shrinkage, better stand-off, and less die drift. A high filler content (such as 85% in weight) within an EMC may shorten the time in mold, lower the mold shrinkage, and reduce the mold warpage. Uniform filler size distribution in the EMC may reduce flow marks, and may enhance flowability. The curing temperature of the EMC may be lower than the release (debonding) temperature of the first adhesive layer 301 if the adhesive layer includes a thermally debonding material. For example, the curing temperature of the EMC may be in a range from 125° C. to 150° C.

The EMC may be cured at a curing temperature to form an EMC matrix 910M that laterally surrounds and embeds each assembly of a set of semiconductor dies (700, 800) and a first underfill material portion 950. The EMC matrix 910M includes a plurality of epoxy molding compound (EMC) die frames that may be laterally adjoined to one another. Each EMC die frame is a portion of the EMC matrix 910M that is located within a respective unit area UA. Thus, each EMC die frame laterally surrounds and embeds a respective a set of semiconductor dies (700, 800) and a respective first underfill material portion 950. Young's modulus of pure epoxy is about 3.35 GPa, and Young's modulus of the EMC may be higher than Young's modulus of pure epoxy by adding additives. Young's modules of EMC may be greater than 3.5 GPa.

In one embodiment, the molding compound material of the EMC matrix 910M may contact a top surface of stress buffer layer 907L. In one embodiment, the entirety of the top surface of the stress buffer layer 907L may be contacted by the EMC matrix 910M. In another embodiment, first segments of the top surface of the stress buffer layer 907L may be contacted by the first underfill material portions 950, and second segments of the top surface of the stress buffer layer 907L may be contacted by the EMC matrix 910M.

According to an aspect of the present disclosure, the molding compound material of the EMC matrix 910M has a higher Young's modulus than the stress buffer layer 907L.

As discussed above, the stress buffer material may include a material that may absorb mechanical stress better than a molding compound material to be subsequently used. For example, the stress buffer material may have the first Young's modulus, and the molding compound material may have the second Young's modulus that is higher than the first Young's modulus. Thus, the stress buffer material deforms more easily than the molding compound material of the EMC matrix 910M. In a non-limiting illustrative example, the ratio of the first Young's modulus to the second Young's modulus may be in a range from 0.001 to 0.90, such as from 0.01 to 0.5 and/or from 0.1 to 0.3.

Further, the stress buffer material may include a material providing more thermal expansion than the molding compound material of the EMC matrix 910M. In one embodiment, the stress buffer material of the stress buffer layer 907L may comprise, and/or may consist essentially of, a material having the first coefficient of thermal expansion at room temperature (i.e., at 20 degrees Celsius), and the molding compound material of the EMC matrix 910M may comprise, and/or may consist essentially of, a material having the second coefficient of thermal expansion at room temperature that is lower than the first coefficient of thermal expansion at room temperature. In a non-limiting illustrative example, the ratio of the first coefficient of thermal expansion to the second coefficient of thermal expansion may be in a range from 1.01 to 10, such as from 1.5 to 5 and/or from 2 to 3.

Portions of the EMC matrix 910M that overlies the horizontal plane including the top surfaces of the semiconductor dies (700, 800) may be removed by a planarization process. For example, the portions of the EMC matrix 910M that overlies the horizontal plane may be removed using a chemical mechanical planarization. The combination of the remaining portion of the EMC matrix 910M, the semiconductor dies (700, 800), the first underfill material portions 950, and the two-dimensional array of interposer structures 920 comprises a reconstituted wafer 900W. Each portion of the EMC matrix 910M located within a unit area UA constitutes an EMC die frame.

Figure 7:
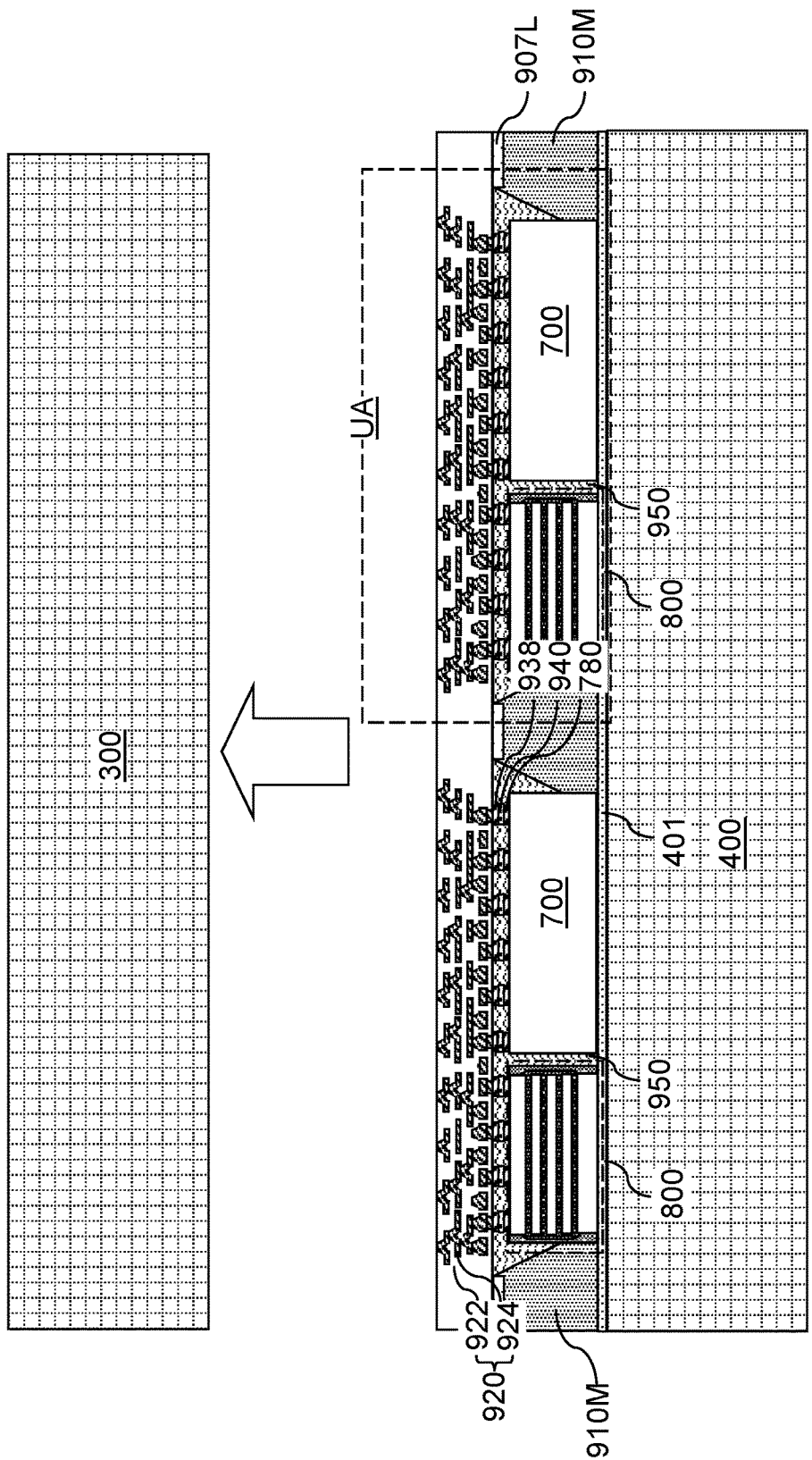
FIG. 7 is a vertical cross-sectional view of a region of the exemplary structure after attaching a second carrier substrate and detaching the first carrier substrate according to an embodiment of the present disclosure.

Referring to FIG. 7, a second adhesive layer 401 may be applied to the physically exposed planar surface of the reconstituted wafer 900W, i.e., the physically exposed surfaces of the EMC matrix 910M, the semiconductor dies (700, 800), and the first underfill material portions 950. In one embodiment, the second adhesive layer 401 may comprise a same material as, or may comprise a different material from, the material of the first adhesive layer 301. If the first adhesive layer 301 comprises a thermally decomposing adhesive material, the second adhesive layer 401 comprises another thermally decomposing adhesive material that decomposes at a higher temperature, or may comprise a light-to-heat conversion material.

A second carrier substrate 400 may be attached to the second adhesive layer 401. The second carrier substrate 400 may be attached to the opposite side of the reconstituted wafer 900W relative to the first carrier substrate 300. Generally, the second carrier substrate 400 may comprise any material that may be used for the first carrier substrate 300. The thickness of the second carrier substrate 400 may be in a range from 500 microns to 2,000 microns, although lesser and greater thicknesses may also be used.

The first adhesive layer 301 may be decomposed by ultraviolet radiation or by a thermal anneal at a debonding temperature. In embodiments in which the first carrier substrate 300 includes an optically transparent material and the first adhesive layer 301 includes an LTHC layer, the first adhesive layer 301 may be decomposed by irradiating ultraviolet light through the transparent carrier substrate. The LTHC layer may be absorb the ultraviolet radiation and generate heat, which decomposes the material of the LTHC layer and cause the transparent first carrier substrate 300 to be detached from the reconstituted wafer 900W. In embodiments in which the first adhesive layer 301 includes a thermally decomposing adhesive material, a thermal anneal process at a debonding temperature may be performed to detach the first carrier substrate 300 from the reconstituted wafer 900W.

Figure 8:
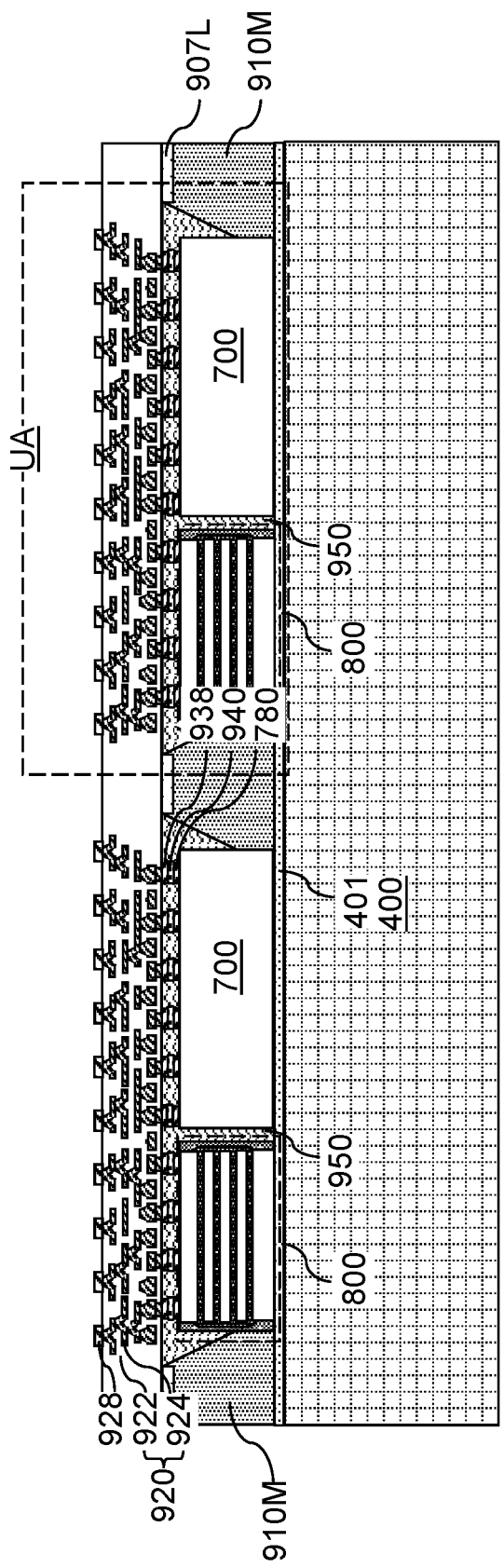
FIG. 8 is a vertical cross-sectional view of a region of the exemplary structure after formation of fan-out bonding pads according to an embodiment of the present disclosure.

Referring to FIG. 8, fan-out bonding pads 928 may be formed by depositing and patterning at least one metallic material that may function as metallic bumps. The metallic fill material for the fan-out bonding pads 928 may include copper. Other suitable materials are within the contemplated scope of disclosure. The thickness of the fan-out bonding pads 928 may be in a range from 5 microns to 100 microns, although lesser or greater thicknesses may also be used. The fan-out bonding pads 928 may have horizontal cross-sectional shapes of rectangles, rounded rectangles, or circles. Other suitable shapes are within the contemplated scope of disclosure. In embodiments in which the fan-out bonding pads 928 are formed as C4 (controlled collapse chip connection) pads, the thickness of the fan-out bonding pads 928 may be in a range from 5 microns to 50 microns, although lesser or greater thicknesses may also be used. Alternatively, the fan-out bonding pads 928 may be configured for microbump bonding (i.e., C2 bonding), and may have a thickness in a range from 30 microns to 100 microns, although lesser or greater thicknesses may also be used. In such an embodiment, the fan-out bonding pads 928 may be formed as an array of microbumps (such as copper pillars) having a lateral dimension in a range from 10 microns to 25 microns, and having a pitch in a range from 20 microns to 50 microns.

The fan-out bonding pads 928 may be formed on the opposite side of the EMC matrix 910M and the two-dimensional array of sets of semiconductor dies (700, 800) relative to the interposer structure layer. The interposer structure layer includes a two-dimensional array of interposer structures 920. Each interposer structure 920 may be located within a respective unit area UA. Each interposer structure 920 may comprise redistribution dielectric layers 922, redistribution wiring interconnects 924 embedded in the redistribution dielectric layers 922, and fan-out bonding pads 928. The fan-out bonding pads 928 may be located on an opposite side of the redistribution-side metal bonding structures 938 relative to the redistribution dielectric layers 922, and are electrically connected to a respective one of the redistribution-side metal bonding structures 938.

Figure 9:
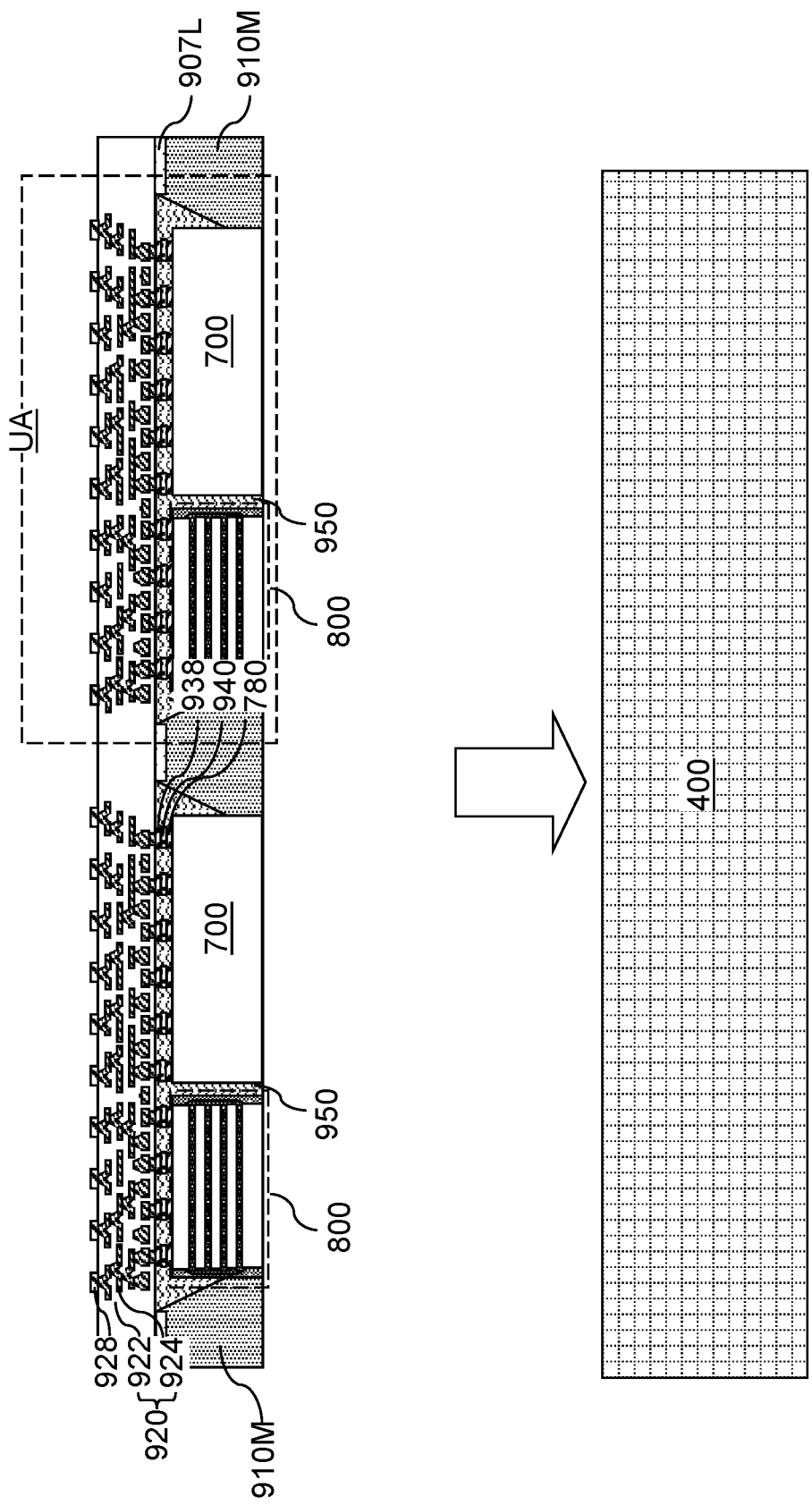
FIG. 9 is a vertical cross-sectional view of a region of the exemplary structure after detaching the second carrier substrate according to an embodiment of the present disclosure.

Referring to FIG. 9, the second adhesive layer 401 may be decomposed by ultraviolet radiation or by a thermal anneal at a debonding temperature. In embodiments in which the second carrier substrate 400 includes an optically transparent material and the second adhesive layer 401 includes an LTHC layer, the second adhesive layer 401 may be decomposed by irradiating ultraviolet light through the transparent carrier substrate. In embodiments in which the second adhesive layer 401 includes a thermally decomposing adhesive material, a thermal anneal process at a debonding temperature may be performed to detach the second carrier substrate 400 from the reconstituted wafer 900W.

Figure 10:
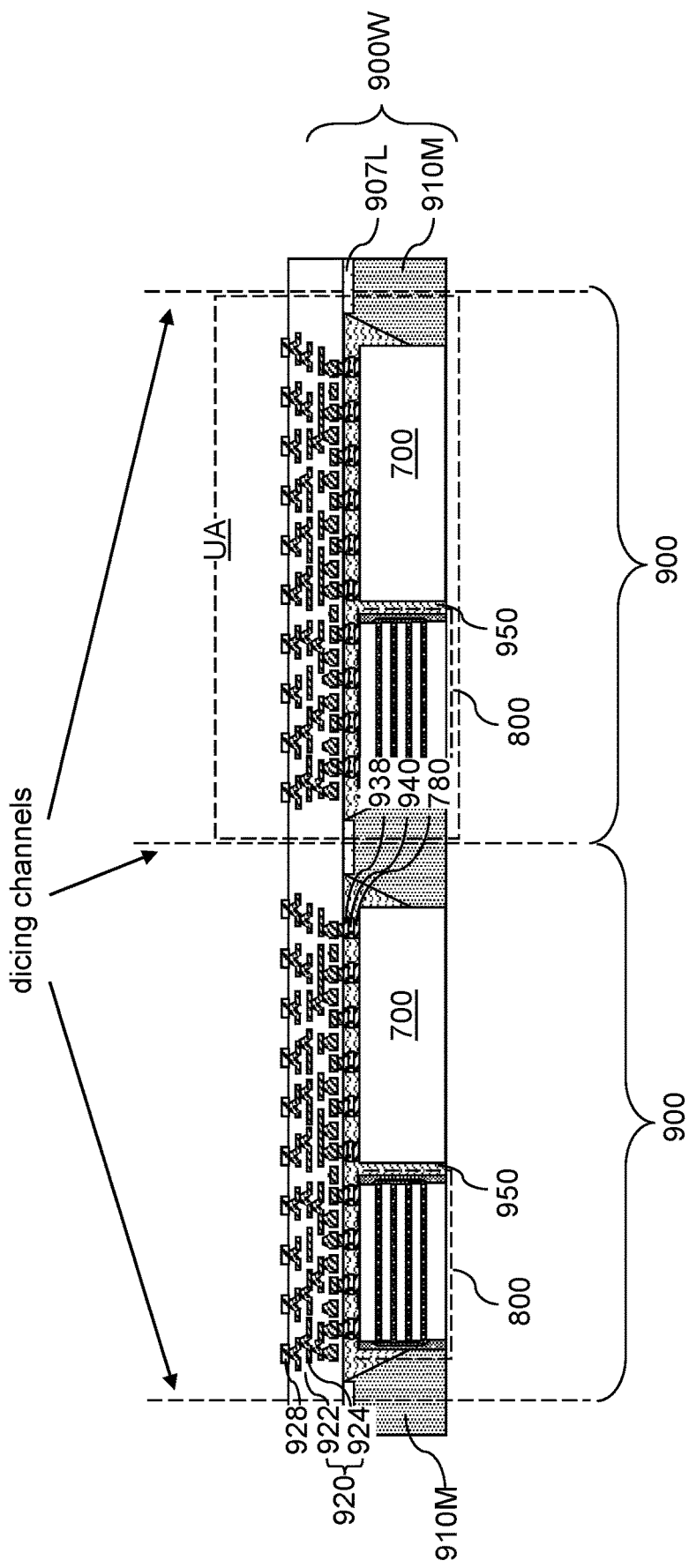
FIG. 10 is a vertical cross-sectional view of a region of the exemplary structure during dicing of a redistribution substrate and the EMC matrix according to an embodiment of the present disclosure.

Referring to FIG. 10, the reconstituted wafer 900W including the fan-out bonding pads 928 may be subsequently diced along dicing channels by performing a dicing process. The dicing channels correspond to the boundaries between neighboring pairs of die areas DA. Each diced unit from the reconstituted wafer 900W comprises a fan-out package 900. In other words, each diced portion of the assembly of the two-dimensional array of sets of semiconductor dies (700, 800), the two-dimensional array of first underfill material portions 950, the EMC matrix 910M, and the two-dimensional array of interposer structures 920 constitutes a fan-out package 900. Each diced portion of the EMC matrix 910M constitutes a molding compound die frame 910. Each diced portion of the interposer structure layer (which includes the two-dimensional array of interposer structures 920) constitutes an interposer structure 920. Each diced portion of the stress buffer layer 907L constitutes a stress buffer structure 907.

Figure 11A:
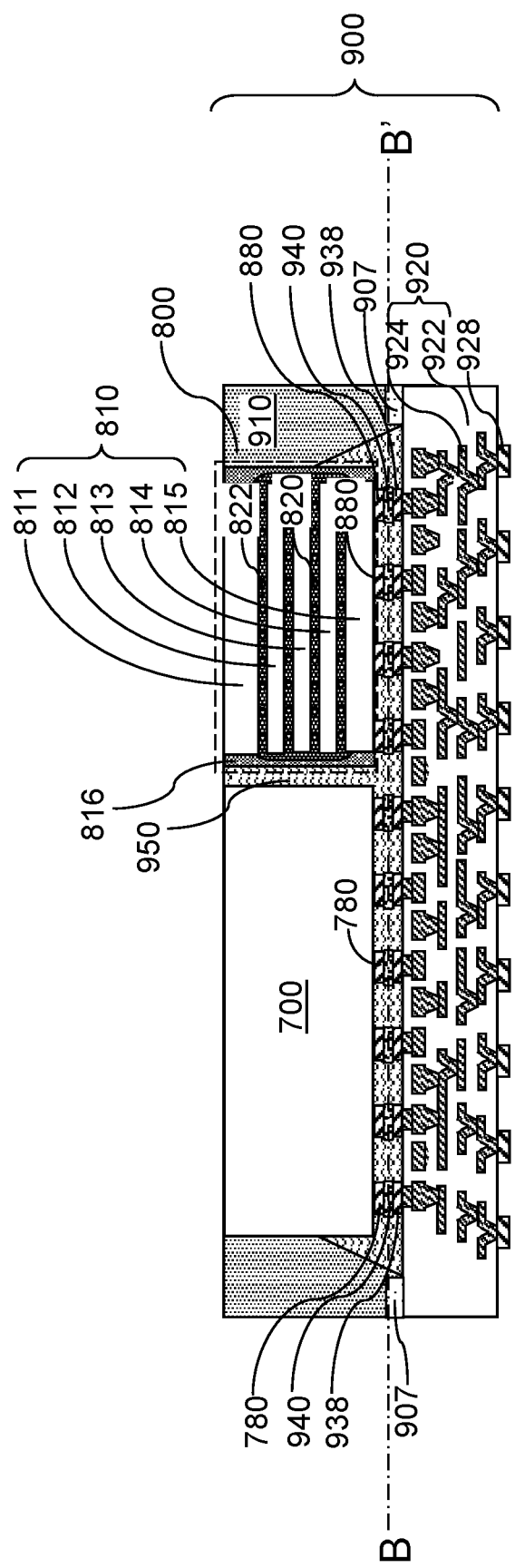
FIG. 11A is a vertical cross-sectional view of a fan-out package according to an embodiment of the present disclosure.
Figure 11B:
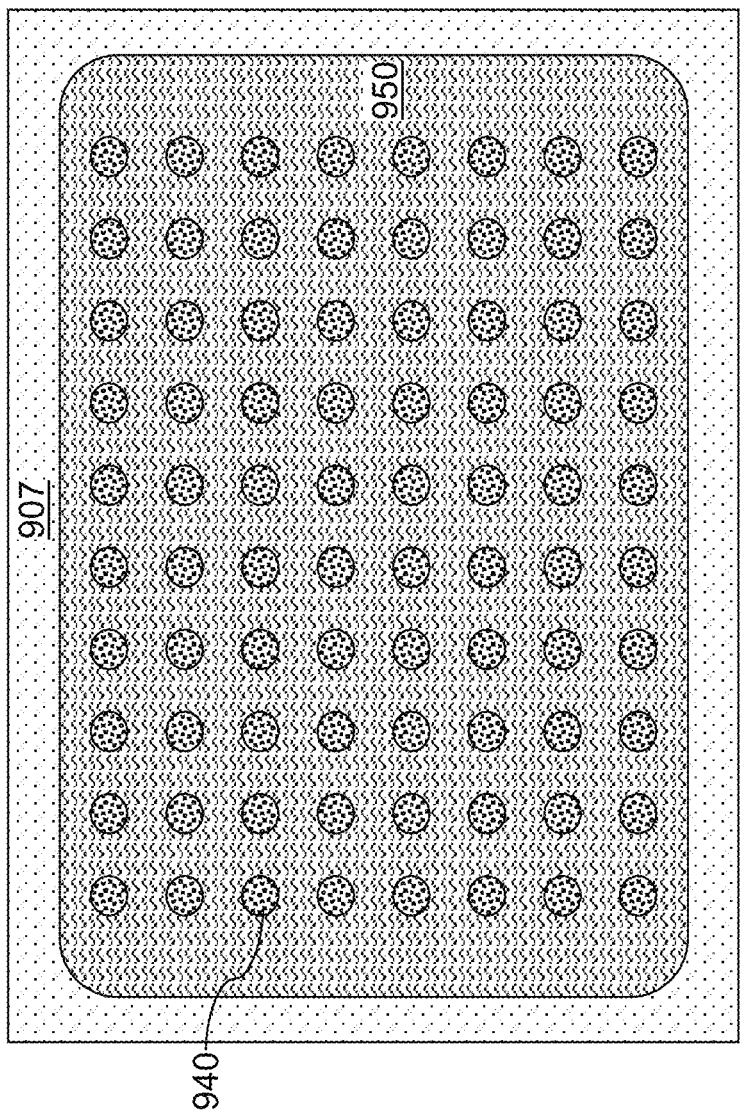
FIG. 11B is a horizontal cross-sectional view of the fan-out package along the horizontal plane B-B' of FIG. 11A.

Referring to FIGS. 11A and 11B, a fan-out package 900 obtained by dicing the exemplary structure at the processing steps of FIG. 10 is illustrated. The fan-out package 900 comprises an interposer structure 920 including redistribution-side metal bonding structures 938, at least one semiconductor die (700, 800) comprising a respective set of die-side metal bonding structures (780, 880) that is attached to the redistribution-side metal bonding structures 938 through a respective set of first solder material portions 940, a first underfill material portion 950 laterally surrounding the redistribution-side metal bonding structures 938 and the die-side metal bonding structures (780, 880) of the at least one semiconductor die (700, 800).

The fan-out package 900 may comprise a molding compound die frame 910 laterally surrounding the at least one semiconductor die (700, 800) and comprising a molding compound material. In one embodiment, the molding compound die frame 910 comprises sidewalls that are vertically coincident with sidewalls of the interposer structure 920, i.e., located within same vertical planes as the sidewalls of the interposer structure 920. Generally, the molding compound die frame 910 may be formed around the at least one semiconductor die (700, 800) after formation of the first underfill material portion 950 within each fan-out package 900. The molding compound material contacts a peripheral portion of a planar surface of the interposer structure 920.

Each fan-out package 900 includes at least one stress buffer structure 907. The at least one stress buffer structure 907 may comprise a single stress buffer structure 907, or a plurality of stress buffer structures 907. In one embodiment, the molding compound material of the fan-out package 900 contacts a top surface of each of the at least one stress buffer structure 907. In one embodiment, one, and/or each, of the at least one stress buffer structure comprises a sidewall that is vertically coincident with one of the sidewalls of the interposer structure. In one embodiment, the at least one stress buffer structure 907 in the fan-out package 900 comprises a single stress buffer structure having an inner periphery that is located outside an area including each of the at least one semiconductor die (700, 800) in a plan view and having an outer periphery that encloses the inner periphery in the plan view. The outer periphery coincides with the outer sidewalls of the molding compound die frame 910 and the sidewalls of the interposer structure 920 in the fan-out package 900.

In one embodiment, the entirety of the top surface of the single stress buffer structure 907 may contact the molding compound die frame 910. In one embodiment, the first underfill material portion 950 may be located entirety within the inner periphery of the single stress buffer structure 907. In one embodiment, the first underfill material portion 950 may contact the inner periphery of the single stress buffer structure 907. In one embodiment, the first underfill material portion 950 may be laterally offset inward from the inner periphery of the single stress buffer structure 907.

Figure 12A:
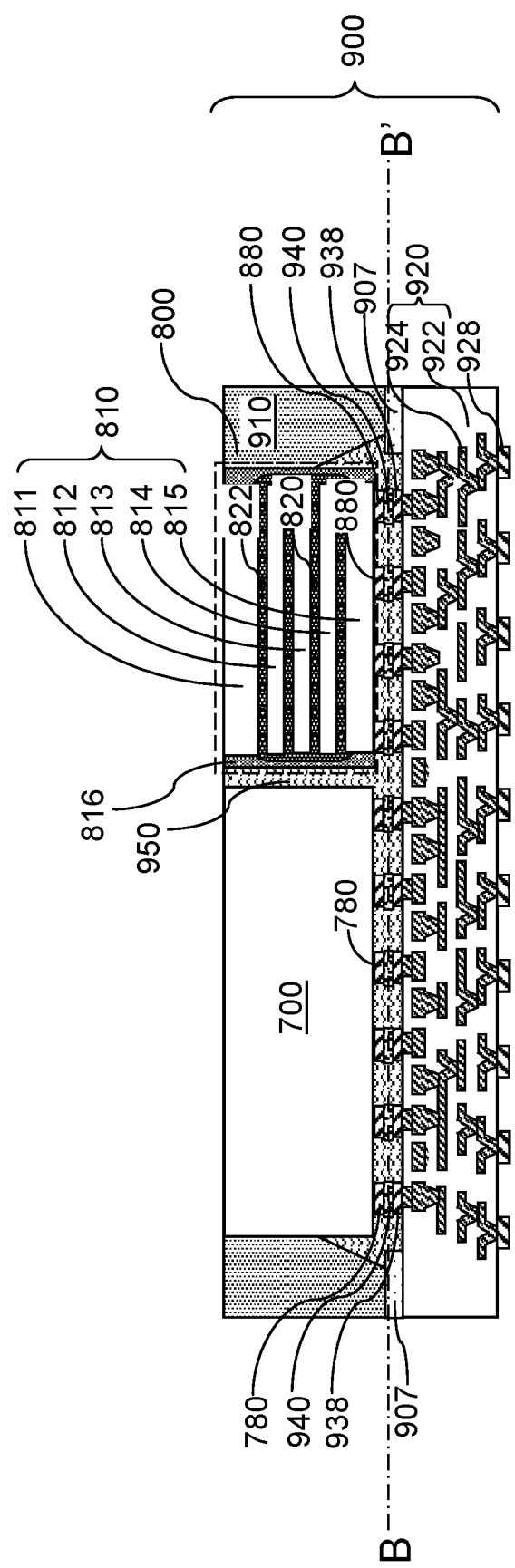
FIG. 12A is a vertical cross-sectional view of a first alternative configuration of the fan-out package according to an embodiment of the present disclosure.
Figure 12B:
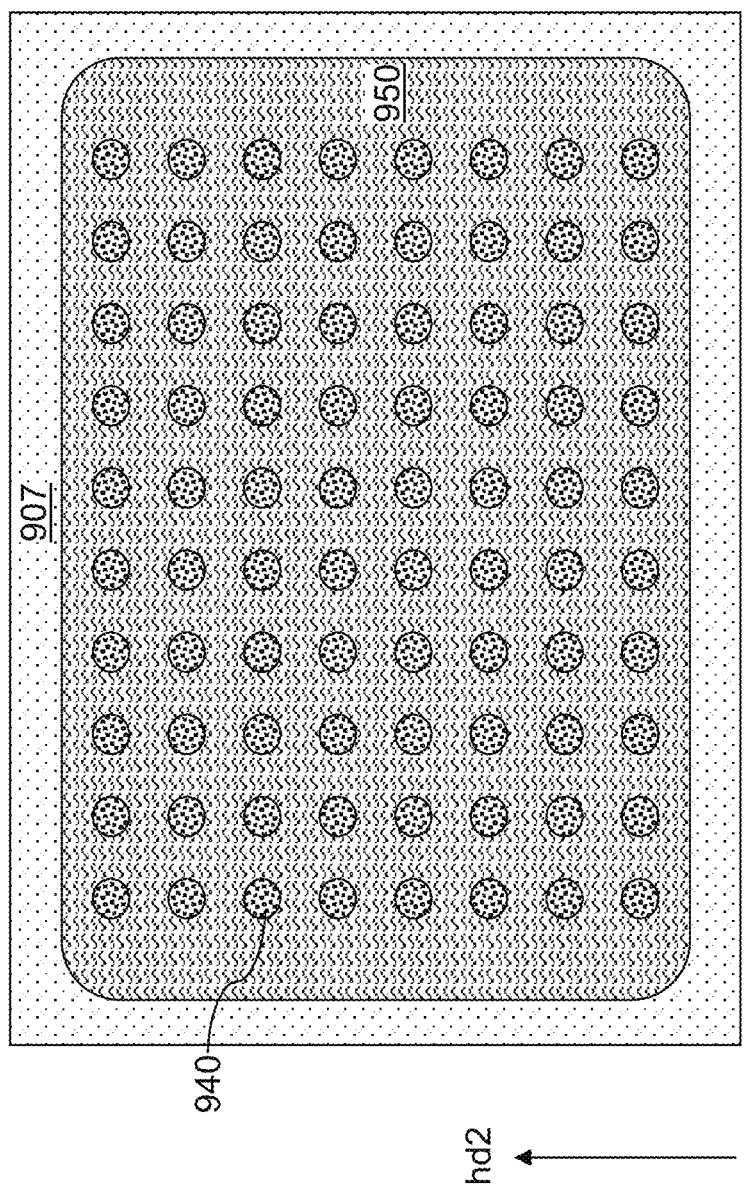
FIG. 12B is a horizontal cross-sectional view of the first alternative configuration of the fan-out package along the horizontal plane B-B' of FIG. 12A.

Referring to FIGS. 12A and 12B, a first alternative configuration of the fan-out package 900 may be derived from the fan-out package 900 of FIGS. 11A and 11B by changing the distance between the inner periphery and the outer periphery of the single stress buffer structure 907 and/or by changing the lateral extent of the first underfill material portion 950. In this alternative configuration, the first underfill material portion 950 may contact an inner segment of the top surface of the single stress buffer structure 907, and the molding compound die frame 910 may contact an outer segment of the top surface of the single stress buffer structure 907.

Figure 13A:
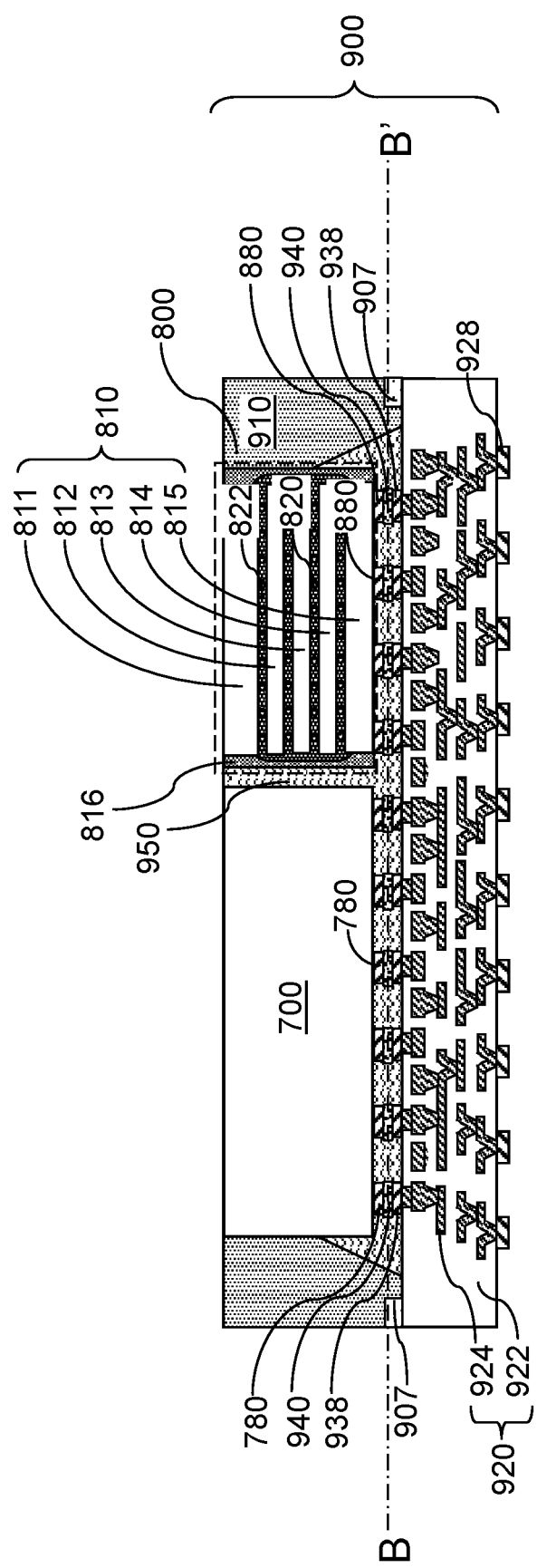
FIG. 13A is a vertical cross-sectional view of a second alternative configuration of the fan-out package according to an embodiment of the present disclosure.
Figure 13B:
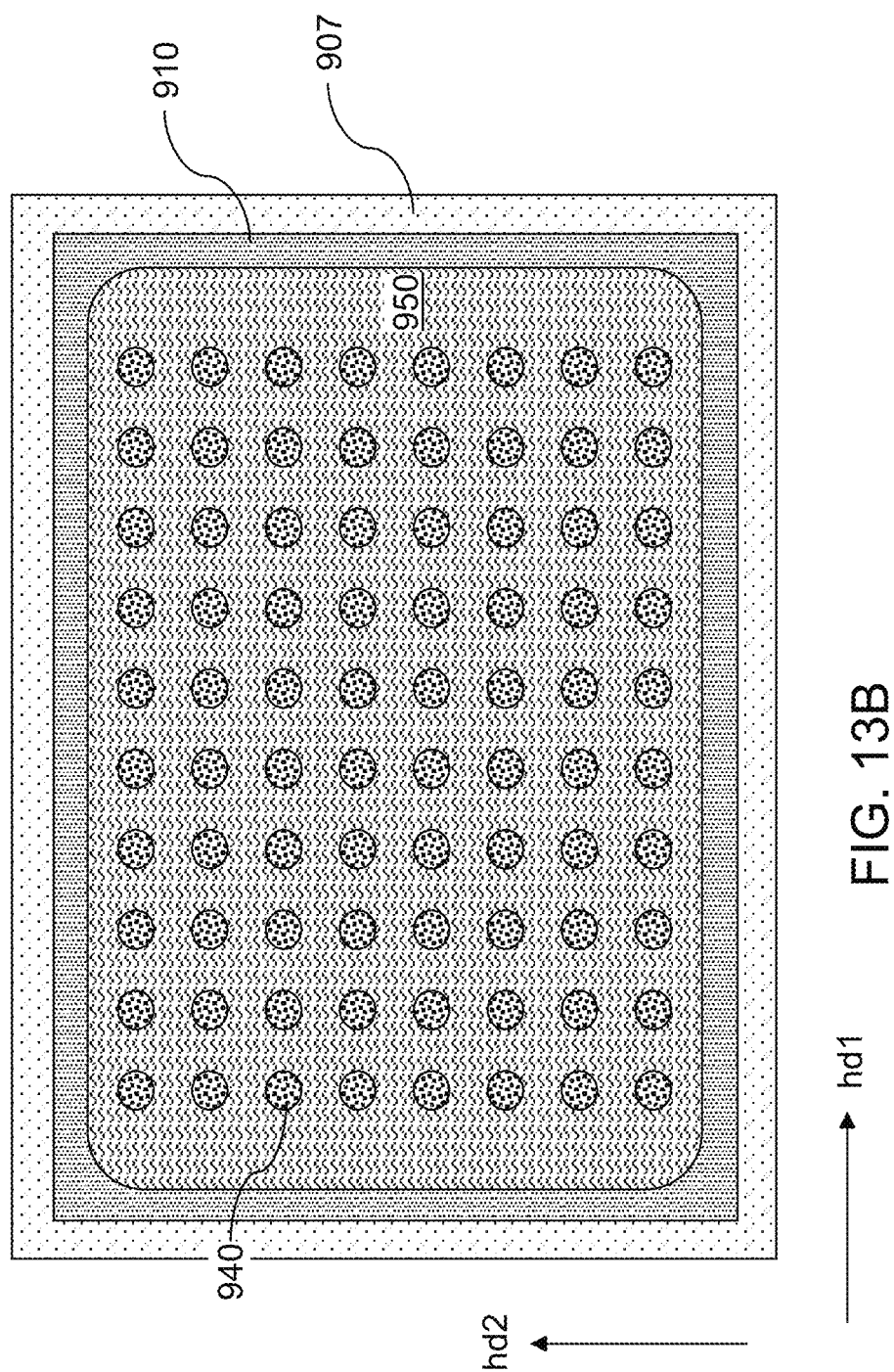
FIG. 13B is a horizontal cross-sectional view of the second alternative configuration of the fan-out package along the horizontal plane B-B' of FIG. 13A.

Referring to FIGS. 13A and 13B, a second alternative configuration of the fan-out package 900 may be derived from the fan-out package 900 of FIGS. 11A and 11B by changing the distance between the inner periphery and the outer periphery of the single stress buffer structure 907 and/or by changing the lateral extent of the first underfill material portion 950. In this alternative, the outer periphery of the first underfill material portion 950 may be laterally spaced inward from the inner periphery of the single stress buffer structure 907. The molding compound die frame 910 may contact a segment of the top surface of the interposer structure 920. The inner periphery of the segment of the top surface of the interposer structure 920 that is contacted by the molding compound die frame 910 may be laterally offset inward from the outer periphery of the segment of the top surface of the interposer structure 920 that is contacted by the molding compound die frame 910 by a lateral spacing, which may be in a range from 10 microns to 1 mm, such as from 30 microns to 300 microns.

Figure 14A:
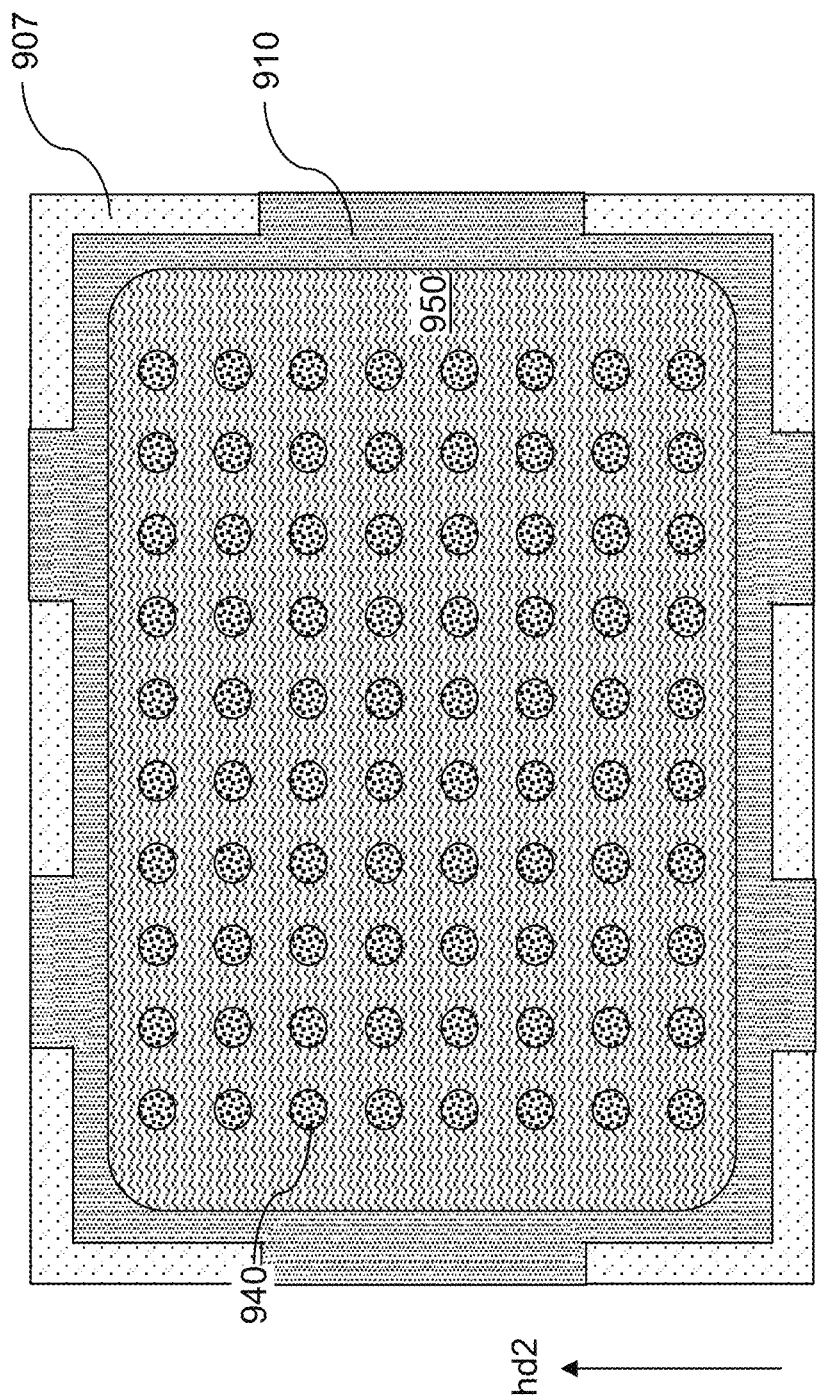
FIG. 14A is a horizontal cross-sectional view of a third alternative configuration of the fan-out package according to an embodiment of the present disclosure.

Referring to FIG. 14A, a horizontal cross-sectional view of a third alternative configuration of the fan-out package 900 is illustrated. The horizontal cross-sectional plane of FIG. 14A corresponds to the horizontal plane B-B' of FIG. 11A, 12A, or 13A.

In the third alternative configuration, the stress buffer structure 907 comprises a plurality of stress buffer structures 907 arranged along the sidewalls of the fan-out package 900. The plurality of stress buffer structures 907 may be laterally spaced from one another, and may have gaps therebetween. In one embodiment, at least one, or each, of the plurality of stress buffer structures 907 may have a respective sidewall that is vertically coincident with a sidewall of the interposer structure 920. In one embodiment, at least one, or each, of the plurality of stress buffer structures 907 may have at least one portion that laterally extend parallel to a most proximal sidewall of the fan-out package 900 and having a uniform width in a range from 200 microns to 1.5 mm, such as from 300 microns to 1 mm.

In one embodiment, the at least one stress buffer structure 907 may comprises at least four stress buffer structures 907 located in proximity to, and outside, four corner regions of the first underfill material portion 950. In one embodiment, the first underfill material portion 950 may comprise a pair of lengthwise edges laterally extending along a first horizontal direction hd1 and a pair of widthwise edges laterally extending along a second horizontal direction hd2 that is perpendicular to the first horizontal direction hd1. In one embodiment, the at least one stress buffer structure 907 may comprise a plurality of stress buffer structures 907 located outside the first underfill material portion 950 and located adjacent to a respective edge selected from the pair of lengthwise edges and the pair of widthwise edges of the first underfill material portion 950 in a plan view. In one embodiment, the stress buffer structures 907 may be laterally spaced from, and located outside, the first underfill material portion 950. In one embodiment a contact area between the interposer structure 920 and the molding compound die frame 910 may continuous extend around the first underfill material portion 950. In one embodiment, the stress buffer structures 907 may contact the first underfill material portion 950.

In one embodiment, the at least one stress buffer structure 907 may comprise one or more stress buffer structures 907 that are located on a sidewall of the fan-out package 900, and does not extend to any corner of the fan-out package 900.

Figure 14B:
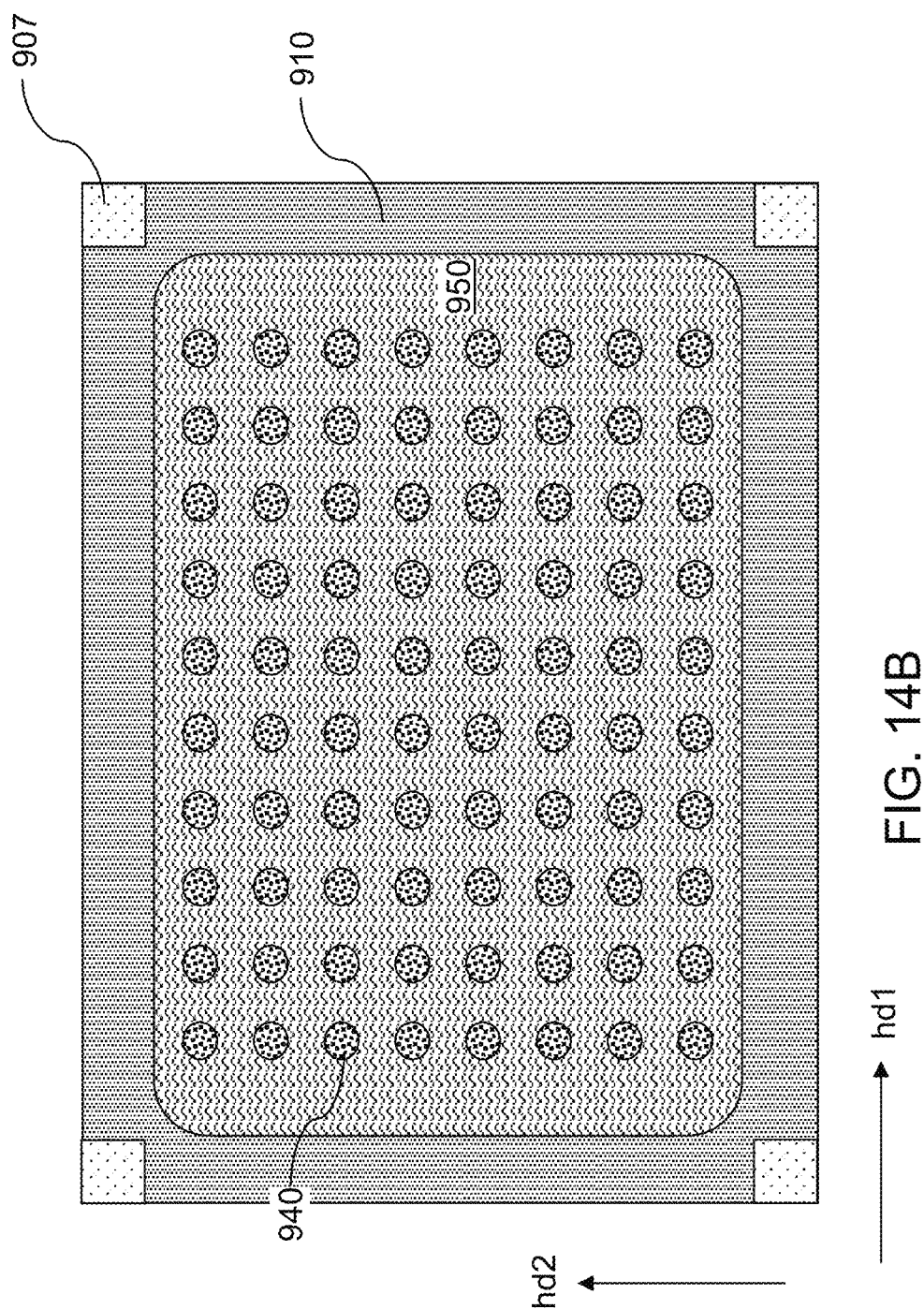
FIG. 14B is a horizontal cross-sectional view of a fourth alternative configuration of the fan-out package according to an embodiment of the present disclosure.

Referring to FIG. 14B, a fourth alternative configuration of the fan-out package 900 is illustrated. The horizontal cross-sectional plane of FIG. 14B corresponds to the horizontal plane B-B' of FIG. 11A, 12A, or 13A.

The at least one stress buffer structure 907 may consist of four stress buffer structures 907 located outside the first underfill material portion 950 and located at four corners of the fan-out package 900 in a plan view. Each of the four stress buffer structures 907 may be located at a corner of the fan-out package 900. The four stress buffer structures 907 may have a rectangular shape, or may have a non-rectangular shape including two straight sidewalls that coincide with sidewalls of the molding compound die frame 910 and at least one additional sidewall contacting surfaces of the molding compound die frame 910.

Figure 14C:
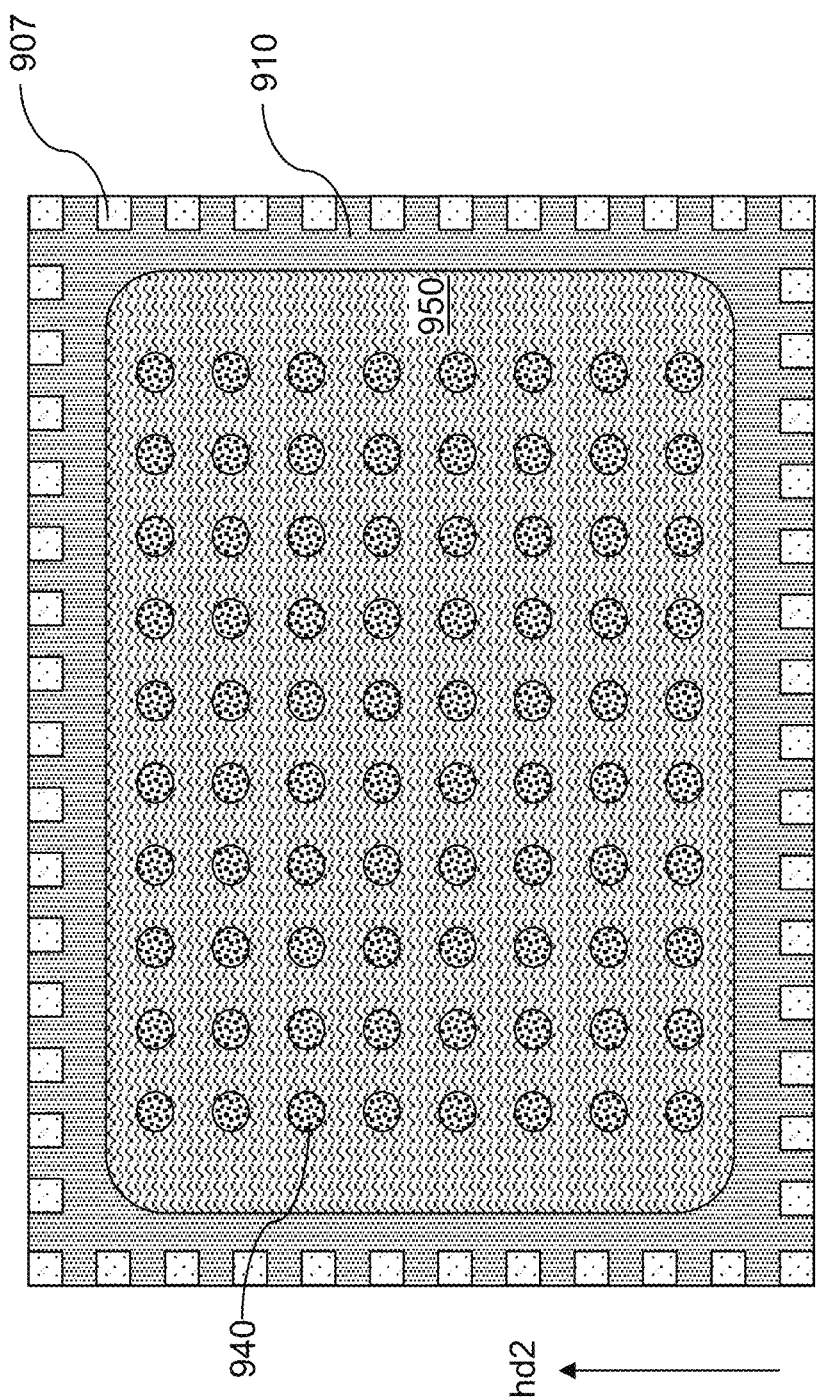
FIG. 14C is a horizontal cross-sectional view of a fifth alternative configuration of the fan-out package according to an embodiment of the present disclosure.

Referring to FIG. 14C, a fifth alternative configuration of the fan-out package 900 is illustrated. The horizontal cross-sectional plane of FIG. 14C corresponds to the horizontal plane B-B' of FIG. 11A, 12A, or 13A.

The at least one stress buffer structure 907 may comprise at least one row of stress buffer structures 907 along a respective sidewall of the fan-out package 900 in a plan view. In one embodiment, the at least one stress buffer structure 907 may comprise four rows of stress buffer structures 907 that are arranged along the four sidewalls of the fan-out package 900. In one embodiment, each of the stress buffer structures 907 may have a respective sidewall that is vertically coincident with a sidewall of the molding compound die frame 910.

Figure 15:
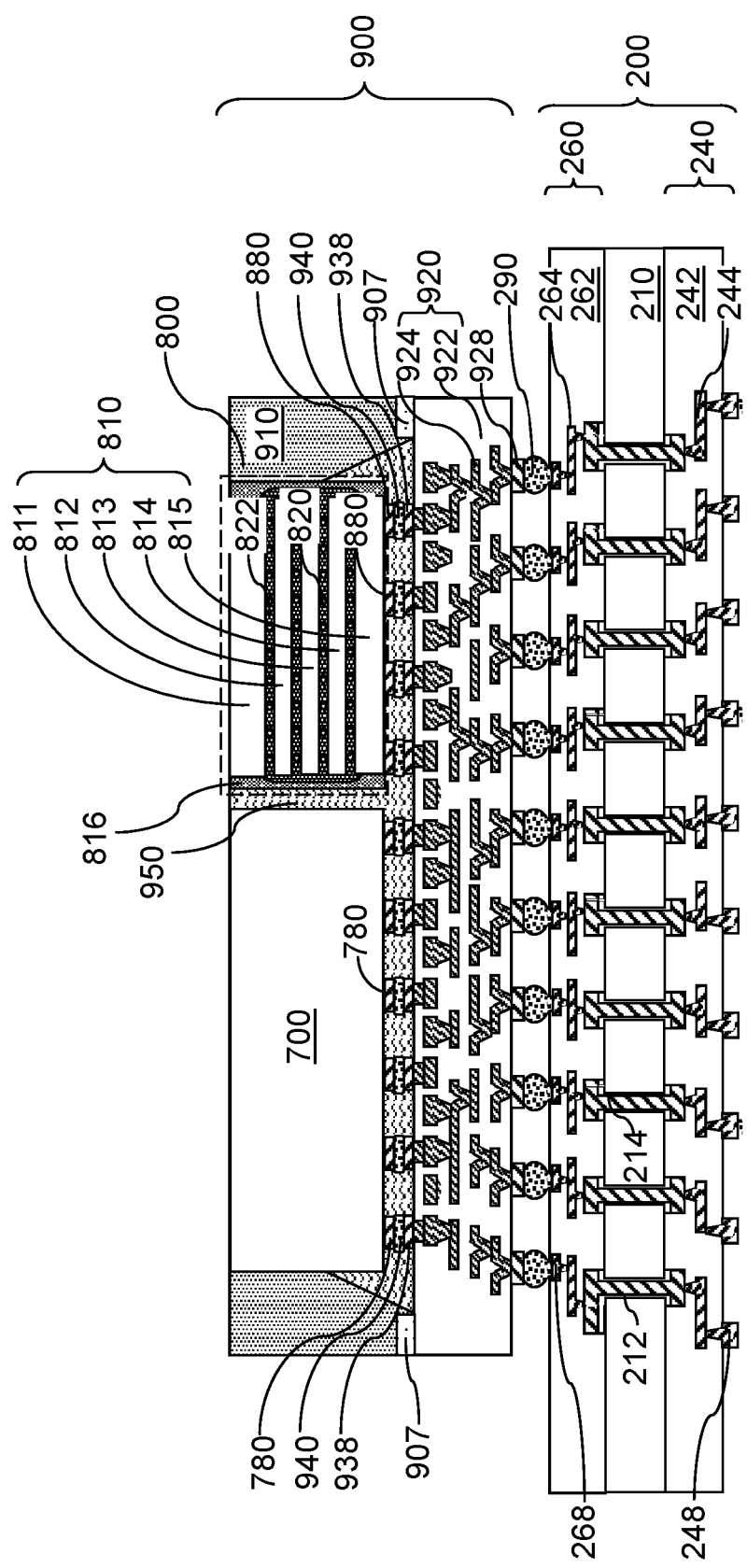
FIG. 15 is a vertical cross-sectional view of an exemplary structure after attaching the fan-out package to a package substrate according to an embodiment of the present disclosure.

Referring to FIG. 15, second solder material portions 290 may be attached to the fan-out bonding pads 928. A package substrate 200 may be bonded to the fan-out package 900 through the second solder material portions 290. The package substrate 200 may be a cored package substrate including a core substrate 210, or a coreless package substrate that does not include a package core. Alternatively, the package substrate 200 may include a system-on-integrated package substrate (SoIS) including redistribution layers and/or dielectric interlayers, at least one embedded interposer (such as a silicon interposer). Such a system-integrated package substrate may include layer-to-layer interconnections using solder material portions, microbumps, underfill material portions (such as molded underfill material portions), and/or an adhesion film. While the present disclosure is described using an exemplary substrate package, it is understood that the scope of the present disclosure is not limited by any particular type of substrate package and may include an SoIS. The core substrate 210 may include a glass epoxy plate including an array of through-plate holes. An array of through-core via structures 214 including a metallic material may be provided in the through-plate holes. Each through-core via structure 214 may, or may not, include a cylindrical hollow therein. Optionally, dielectric liners 212 may be used to electrically isolate the through-core via structures 214 from the core substrate 210.

The package substrate 200 may include board-side surface laminar circuit (SLC) 240 and a chip-side surface laminar circuit (SLC) 260. The board-side SLC may include board-side insulating layers 242 embedding board-side wiring interconnects 244. The chip-side SLC 260 may include chip-side insulating layers 262 embedding chip-side wiring interconnects 264. The board-side insulating layers 242 and the chip-side insulating layers 262 may include a photosensitive epoxy material that may be lithographically patterned and subsequently cured. The board-side wiring interconnects 244 and the chip-side wiring interconnects 264 may include copper that may be deposited by electroplating within patterns in the board-side insulating layers 242 or the chip-side insulating layers 262.

In one embodiment, the package substrate 200 includes a chip-side surface laminar circuit 260 comprising chip-side wiring interconnects 264 connected to an array of chip-side bonding pads 268 that is bonded to the array of second solder material portions 290, and a board-side surface laminar circuit 240 including board-side wiring interconnects 244 connected to an array of board-side bonding pads 248. The array of board-side bonding pads 248 is configured to allow bonding through solder balls. The array of chip-side bonding pads 268 is configured to allow bonding through C4 solder balls. Generally, any type of package substrate 200 may be used. While the present disclosure is described using an embodiment in which the package substrate 200 includes a chip-side surface laminar circuit 260 and a board-side surface laminar circuit 240, embodiments are expressly contemplated herein in which one of the chip-side surface laminar circuit 260 and the board-side surface laminar circuit 240 is omitted, or is replaced with an array of bonding structures such as microbumps. In an illustrative example, the chip-side surface laminar circuit 260 may be replaced with an array of microbumps or any other array of bonding structures.

The second solder material portions 290 attached to the fan-out bonding pads 928 of the fan-out package 900 may be disposed on the array of the chip-side bonding pads 268 of the package substrate 200. A reflow process may be performed to reflow the second solder material portions 290, thereby inducing bonding between the fan-out package 900 and the package substrate 200. In one embodiment, the second solder material portions 290 may include C4 solder balls, and the fan-out package 900 may be attached to the package substrate 200 using an array of C4 solder balls.

Figure 16:
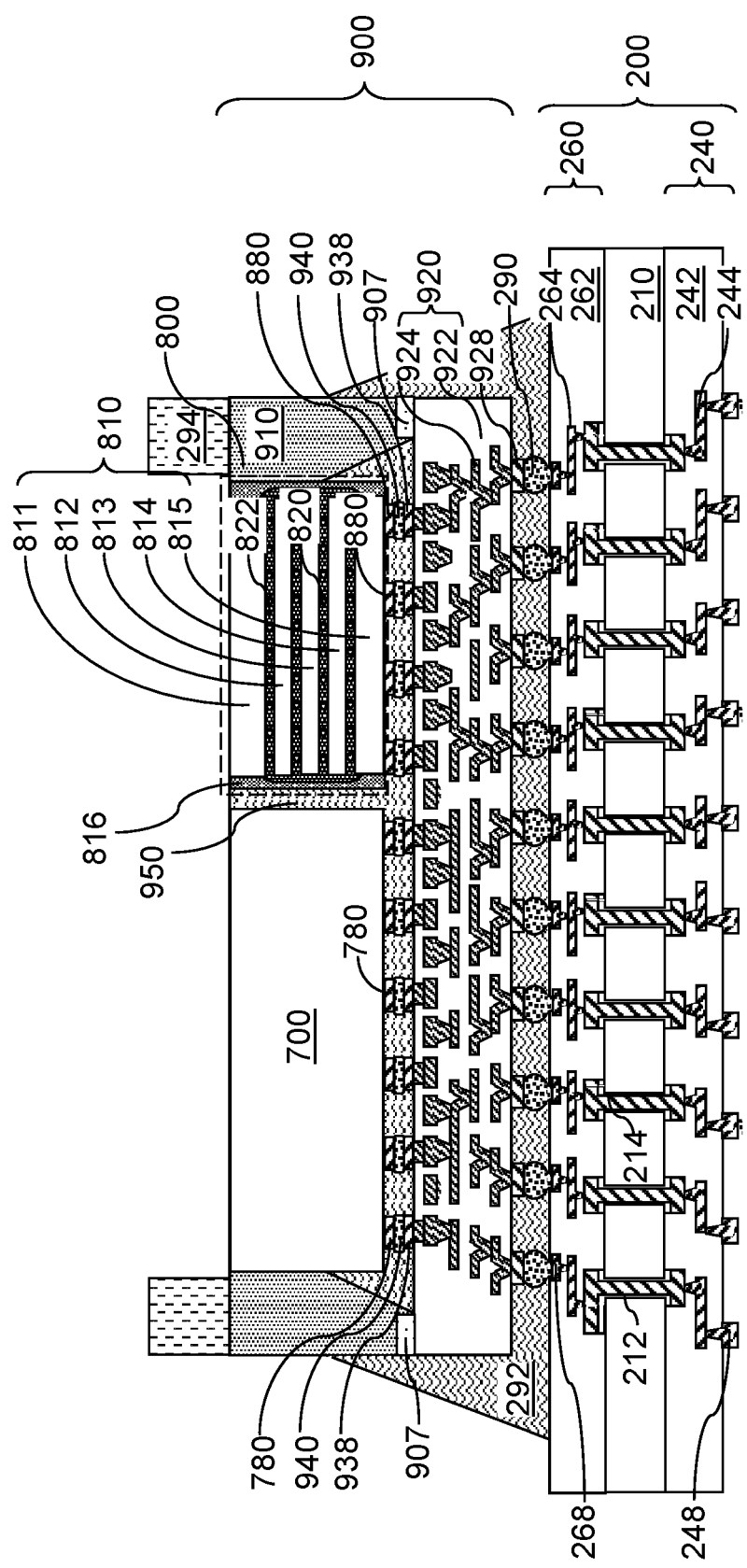
FIG. 16 is a vertical cross-sectional view of the exemplary structure after formation of a second underfill material portion according to an embodiment of the present disclosure.

Referring to FIG. 16, a second underfill material portion 292 may be formed around the second solder material portions 290 by applying and shaping a second underfill material. The second underfill material portion 292 may be formed around the second solder material portions 290 by applying and shaping the second underfill material. The second underfill material portion 292 may be formed by injecting the second underfill material around the array of second solder material portions 290 after the second solder material portions 290 are reflowed. Any known underfill material application method may be used, which may be, for example, the capillary underfill method, the molded underfill method, or the printed underfill method.

The second underfill material portion 292 is formed between the interposer structure 920 and the package substrate 200. According to an aspect of the present disclosure, the second underfill material portion 292 may be formed directly on each sidewall of the molding compound die frame 910 and directly on a sidewall of one, and/or each, of the at least one stress buffer structure 907.

The second underfill material portion 292 may contact each of the second solder material portions 290 (which may be C4 solder balls or C2 solder caps), and may contact vertical sidewalls of the fan-out package 900. The second underfill material portion is formed between the interposer structure 920 and the package substrate 200. The second underfill material portion laterally surrounds, and contacts, the array of second solder material portions 290 and the fan-out package 900.

Optionally, a stabilization structure 294, such as a cap structure or a ring structure, may be attached to the assembly of the fan-out package 900 and the package substrate 200 to reduce deformation of the assembly during subsequent processing steps and/or during usage of the assembly.

Figure 17:
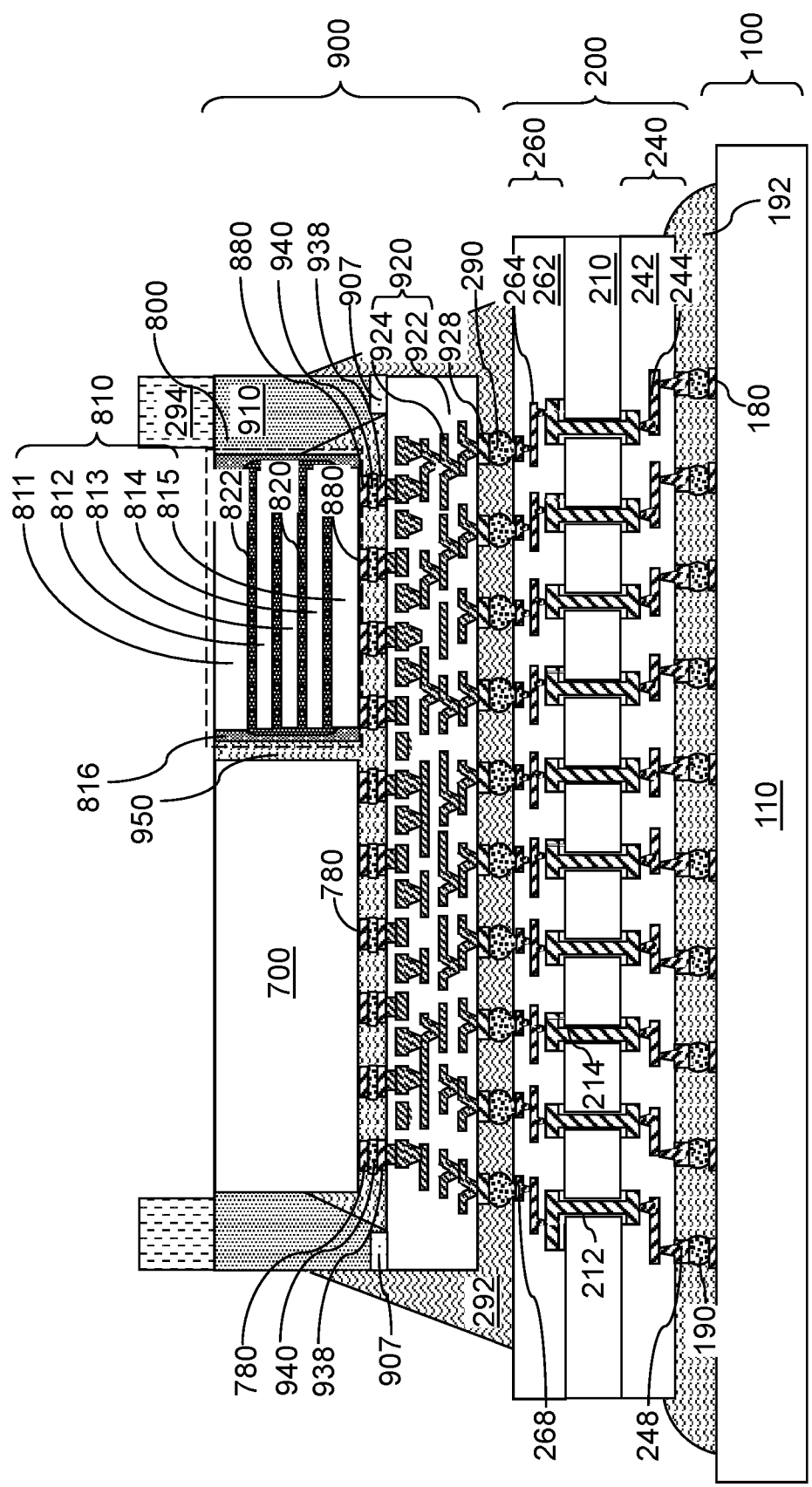
FIG. 17 is a vertical cross-sectional view of the exemplary structure after the package substrate is attached to a printed circuit board (PCB) according to an embodiment of the present disclosure.

Referring to FIG. 17, a printed circuit board (PCB) 100 including a PCB substrate 110 and PCB bonding pads 180 may be provided. The PCB 100 includes a printed circuitry (not shown) at least on one side of the PCB substrate 110. An array of solder joints 190 may be formed to bond the array of board-side bonding pads 248 to the array of PCB bonding pads 180. The solder joints 190 may be formed by disposing an array of solder balls between the array of board-side bonding pads 248 and the array of PCB bonding pads 180, and by reflowing the array of solder balls. An underfill material portion 192 may be formed around the solder joints 190 by applying and shaping an underfill material. The package substrate 200 is attached to the PCB 100 through the array of solder joints 190.

Figure 18:
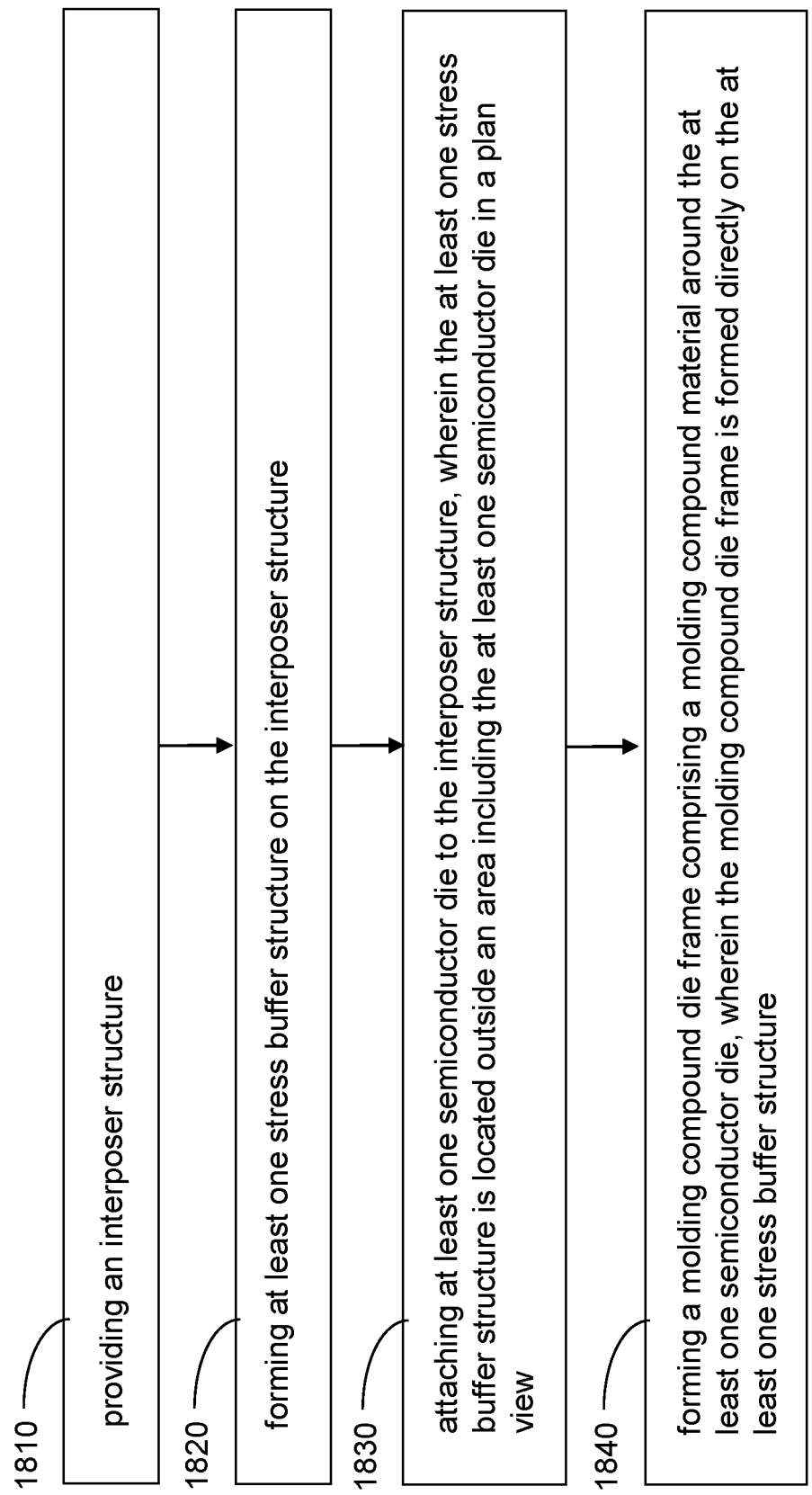
FIG. 18 is a flowchart illustrating steps for forming an exemplary structure according to an embodiment of the present disclosure.

Referring to FIG. 18, a flowchart illustrates steps for forming an exemplary structure according to an embodiment of the present disclosure.

Referring step 1810 and FIGS. 1A and 1B, an interposer structure 920 is provided.

Referring to step 1820 and FIGS. 2A and 2B, at least one stress buffer structure 907 (including a portion of a stress buffer layer 907L) may be formed on the interposer structure 920.

Referring to step 1830 and FIGS. 3A-4C, at least one semiconductor die (700, 800) may be attached to the interposer structure 920 using first solder material portions 940. The at least one stress buffer structure 907 is located outside an area including the at least one semiconductor die (700, 800) in a plan view.

Referring to step 1840 and FIGS. 5-17, a molding compound die frame 10 comprising a molding compound material may be formed around the at least one semiconductor die (700, 800). The molding compound die frame 910 may be formed directly on the at least one stress buffer structure 907.

Referring to all drawings and according to various embodiments of the present disclosure, a structure including a fan-out package 900 is provided, which may include: at least one semiconductor die (700, 800) attached to an interposer structure 920; a molding compound die frame 910 laterally surrounding the at least one semiconductor die (700, 800) and comprising a molding compound material; and at least one stress buffer structure 907 located on the interposer structure 920 and may include a stress buffer material having a first Young's modulus, wherein the molding compound die frame 910 may include a molding compound material having a second Young's modulus that may be greater than the first Young's modulus.

In one embodiment, the stress buffer material has a first coefficient of thermal expansion at room temperature; and the molding compound material has a second coefficient of thermal expansion at room temperature that is lower than the first coefficient of thermal expansion at room temperature.

In one embodiment, the at least one semiconductor die (700, 800) may be bonded to the interposer structure through an array of solder material portions 940; and an underfill material portion 950 laterally surrounds the array of solder material portions 940. In one embodiment, the molding compound die frame 910 contacts, and may laterally surround, the underfill material portion 950.

In one embodiment, the at least one stress buffer structure 107 directly contacts a planar surface of the interposer structure 920 and contacts the underfill material portion 950. In one embodiment, the underfill material portion 950 may include a pair of lengthwise edges laterally extending along a first horizontal direction hd1 and a pair of widthwise edges laterally extending along a second horizontal direction hd2; and the at least one stress buffer structure 907 comprises a plurality of stress buffer structures 907 located outside the underfill material portion 950 and located adjacent to a respective edge selected from the pair of lengthwise edges and the pair of widthwise edges in a plan view.

In one embodiment, the interposer structure 920 may include: redistribution wiring interconnects 924 embedded in redistribution dielectric layers 922; redistribution-side metal bonding structures 938 bonded the solder material portions 940; and fan-out bonding pads 928 located on an opposite side of the redistribution-side metal bonding structures 938 and electrically connected to a respective one of the redistribution-side metal bonding structures 938 through a respective subset of the redistribution wiring interconnects 924.

In one embodiment, the molding compound die frame 910 may directly contact a top surface of each of the at least one stress buffer structure 907.

In one embodiment, the molding compound die frame 910 may include sidewalls that are vertically coincident with sidewalls of the interposer structure 920. In one embodiment, one of the at least one stress buffer structure 907 may include a sidewall that is vertically coincident with one of the sidewalls of the interposer structure 920.

In one embodiment, the at least one stress buffer structure 907 may include a single stress buffer structure 907 having an inner periphery that is located outside an area including each of the at least one semiconductor die (700, 800) in a plan view and having an outer periphery that encloses the inner periphery in the plan view.

In one embodiment, the at least one stress buffer structure 907 may include four stress buffer structures 907 located in proximity to, and outside, four corner regions of the underfill material portion.

According to another aspect of the present disclosure, a chip package structure is provided, which may include: a fan-out package 900 including an interposer structure 920, at least one semiconductor die (700, 800) attached to the interposer structure 920, a molding compound die frame 910 laterally surrounding the at least one semiconductor die (700, 800) and comprising a molding compound material, and at least one stress buffer structure 907 located on the interposer structure 920 and comprising a stress buffer material having a lower Young's modulus than the molding compound material and in direct contact with the molding compound die frame 910; and a package substrate 200 that may be attached to the fan-out package 900 via an array of second solder material portions 290.

In one embodiment, the molding compound die frame 910 may contact each of the at least one stress buffer structure 907 at a respective planar surface that is parallel to a horizontal surface of the interposer structure 920.

In one embodiment, the chip package structure may include: an array of solder material portions 940 located between the interposer structure 920 and the at least one semiconductor die (700, 800); a first underfill material portion 950 laterally surrounding the array of solder material portions 940 and laterally surrounded by the molding compound die frame 910; and a second underfill material portion 292 laterally surrounding the fan-out package 900. In one embodiment, the second underfill material portion 292 contacts a sidewall of one of the at least one stress buffer structure 907.

The various structures and methods of the present disclosure may be used to provide a chip package structure including a fan-out package 900 including at least one stress buffer structure 907, which deforms more than the molding compound material of the molding compound die frame 910 and absorbs mechanical and/or thermal stress. The various methods and structures of the present disclosure may be used to reduce deformation of a fan-out package 900 and to increase the reliability of the fan-out package 900.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A chip package structure, comprising:
a fan-out package that comprises at least one semiconductor die attached to an interposer structure via an array of first solder material portions, a molding compound die frame laterally surrounding the at least one semiconductor die and comprising a molding compound material, and at least one stress buffer structure located on the interposer structure and comprising a stress buffer material having a first Young's modulus, wherein the molding compound material has a second Young's modulus that is greater than the first Young's modulus;
a package substrate that is attached to the fan-out package via an array of second solder material portions;
a first underfill material portion laterally surrounding the array of the first solder material portions and laterally surrounded by the molding compound die frame; and
a second underfill material portion laterally surrounding the fan-out package,
wherein the second underfill material portion contacts a sidewall of one of the at least one stress buffer structure.

2. The fan-out package of claim 1, wherein:
the stress buffer material has a first coefficient of thermal expansion at room temperature; and
the molding compound material has a second coefficient of thermal expansion at room temperature that is lower than the first coefficient of thermal expansion at room temperature.

3. The chip package structure of claim 1, wherein the molding compound die frame contacts, and laterally surrounds, the first underfill material portion.

4. The chip package structure of claim 1, wherein the at least one stress buffer structure directly contacts a planar surface of the interposer structure and contacts the first underfill material portion.

5. The chip package structure of claim 1, wherein:
the first underfill material portion comprises a pair of lengthwise edges laterally extending along a first horizontal direction and a pair of widthwise edges laterally extending along a second horizontal direction; and
the at least one stress buffer structure comprises a plurality of stress buffer structures located outside the first underfill material portion and located adjacent to a respective edge selected from the pair of lengthwise edges and the pair of widthwise edges in a plan view.

6. The chip package structure of claim 1, wherein the interposer structure comprises:
redistribution wiring interconnects embedded in redistribution dielectric layers;
redistribution-side metal bonding structures bonded to the array of the first solder material portions; and
fan-out bonding pads located on an opposite side of the redistribution-side metal bonding structures and electrically connected to a respective one of the redistribution-side metal bonding structures through a respective subset of the redistribution wiring interconnects.

7. The chip package structure of claim 1, wherein:
the molding compound die frame comprises sidewalls that are vertically coincident with sidewalls of the interposer structure; and
one of the at least one stress buffer structure comprises a sidewall that is vertically coincident with one of the sidewalls of the interposer structure.

8. The chip package structure of claim 1, wherein the at least one stress buffer structure comprises a single stress buffer structure having an inner periphery that is located outside an area including each of the at least one semiconductor die in a plan view and having an outer periphery that encloses the inner periphery in the plan view.

9. The chip package structure of claim 1, wherein the at least one stress buffer structure comprises four stress buffer structures located in proximity to, and outside, four corner regions of the first underfill material portion.

10. The chip package structure of claim 1, wherein the second underfill material portion contacts sidewalls of the molding compound die frame.

11. The chip package structure of claim 1, wherein the at least one stress buffer structure comprises at least one row of discrete stress buffer structures that are spaced apart among one another, wherein the second underfill material portion contacts edges of interfaces between the at least one row of discrete stress buffer structures and the molding compound die frame.

12. The chip package structure of claim 1, wherein each of the at least one stress buffer structure contacts the interposer structure within a horizontal plane including an interface between the first underfill material portion and the interposer structure.

13. The chip package structure of claim 1, wherein:
the molding compound die frame contacts the interposer structure; and
each of the at least one stress buffer structure contacts the interposer structure within a horizontal plane including an interface between the molding compound die frame and the interposer structure.

14. A chip package structure, comprising:
a fan-out package including an interposer structure, at least one semiconductor die attached to the interposer structure via an array of first solder material portions, a molding compound die frame laterally surrounding the at least one semiconductor die and comprising a molding compound material, and at least one stress buffer structure located on the interposer structure and comprising a stress buffer material having a lower Young's modulus than the molding compound material and in direct contact with the molding compound die frame, wherein the at least one stress buffer structure does not have an areal overlap with any of the at least one semiconductor die in a plan view;
a package substrate that is attached to the fan-out package via an array of second solder material portions;
a first underfill material portion laterally surrounding the array of first solder material portions and laterally surrounded by the molding compound die frame; and
a second underfill material portion laterally surrounding the fan-out package,
wherein the second underfill material portion contacts a sidewall of one of the at least one stress buffer structure.

15. The chip package structure of claim 14, wherein the molding compound die frame contacts each of the at least one stress buffer structure at a respective planar surface that is parallel to a horizontal surface of the interposer structure.

16. A chip package structure, comprising:
a fan-out package comprising at least one semiconductor die attached to an interposer structure, a molding compound die frame laterally surrounding the at least one semiconductor die and comprising a molding compound material, and at least one stress buffer structure in contact with the molding compound die frame and comprising a stress buffer material having a first Young's modulus,
wherein the molding compound material has a second Young's modulus that is greater than the first Young's modulus;
a package substrate that is attached to the fan-out package;
a first underfill material portion contacting a top surface of the interposer structure and a bottom surface of each of the at least one semiconductor die; and
a second underfill material portion comprising a horizontally-extending portion contacting a bottom surface of the interposer structure and a vertically-extending portion laterally surrounding the fan-out package and contacting a sidewall of one of the at least one stress buffer structure.

17. The chip package structure of claim 16, wherein the at least one stress buffer structure contacts a segment of the top surface of the interposer structure.

18. The chip package structure of claim 16, wherein the at least one stress buffer structure is not in direct contact with the first underfill material portion.

19. The chip package structure of claim 16, wherein the at least one stress buffer structure comprises a plurality of stress buffer structures that are laterally spaced among one another, and are not in direct contact among one another.

20. The chip package structure of claim 16, wherein each of the at least one stress buffer structure comprises a respective bottom surface in contact with the interposer structure, a respective top surface and a respective set of inner sidewalls in contact with the molding compound die frame, and a respective set of at least one outer sidewall that is not in direct contact with the interposer or the molding compound die frame.

* * * * *